United States Patent [19]

Tsuji

[11] Patent Number: 5,831,908
[45] Date of Patent: Nov. 3, 1998

[54] DATA OUTPUT CIRCUIT, INTERMEDIATE POTENTIAL SETTING CIRCUIT, AND SEMICONDUCTOR INTEGRATED CIRCUIT

[75] Inventor: Keitaro Tsuji, Tokyo, Japan

[73] Assignee: NKK Corporation, Japan

[21] Appl. No.: 882,399

[22] Filed: Jun. 25, 1997

Related U.S. Application Data

[63] Continuation of Ser. No. 507,943, Jul. 27, 1995, Pat. No. 5,698,994.

[30] Foreign Application Priority Data

| Jul. 29, 1994 | [JP] | Japan | 6-197666 |
| Aug. 31, 1994 | [JP] | Japan | 6-230461 |
| Nov. 30, 1994 | [JP] | Japan | 6-321749 |

[51] Int. Cl.$^6$ ............................................. G11C 7/00
[52] U.S. Cl. ........................ 365/189.05; 365/189.09
[58] Field of Search .................... 365/189.09, 189.05, 365/190

[56] References Cited

U.S. PATENT DOCUMENTS

| 4,272,832 | 6/1981 | Ito | 365/189.05 |
| 4,300,213 | 11/1981 | Tanimura et al. | 365/190 |
| 4,988,888 | 1/1991 | Hirose et al. | 307/443 |
| 5,166,558 | 11/1992 | Ohsawa | 307/475 |
| 5,179,300 | 1/1993 | Roland et al. | 307/443 |
| 5,306,965 | 4/1994 | Asprey | 307/448 |
| 5,377,149 | 12/1994 | Gaultier | 365/203 |
| 5,420,525 | 5/1995 | Maloberti et al. | 326/27 |
| 5,450,019 | 9/1995 | McClure et al. | 326/28 |
| 5,491,432 | 2/1996 | Wong et al. | 326/86 |

Primary Examiner—David C. Nelms
Assistant Examiner—Michael T. Tran
Attorney, Agent, or Firm—Nixon & Vanderhye

[57] ABSTRACT

A data output circuit includes a ground terminal, a power supply terminal, an output terminal having parasitic capacitor, a PMOS transistor having a current path connected between the power supply terminal and the output terminal and a gate to which one of first and second complementary data signals is supplied, an NMOS transistor having a current path connected between the ground terminal and the output terminal and a gate to which the other of the first and second complementary data signals is supplied, and a gate control section for feeding back the potential of the output terminal to the gates of the transistors and to change the potential of the output terminal toward a predetermined intermediate level within the voltage ranged between the ground terminal and the power supply terminal before the first and second complementary data signals are supplied. An intermediate potential setting circuit includes two MOS transistors having different conductivity types and connected in series between reference power supplies, first and second gate control units, respectively connected to gates of the transistors, for separately ON/OFF-controlling the transistors, a load capacitor connected between the connection node of the transistors and one of the reference power supplies,.a control unit, connected between the connection node and the first and second gate control units, for feeding back a potential of the connection node to the first and second gate control units to selectively perform control to turn on the transistors, an external control unit for externally supplying a control signal to the first and second gate control units, and an output terminal, connected to the connection node, for extracting an intermediate potential output as a potential of the load capacitor.

3 Claims, 13 Drawing Sheets

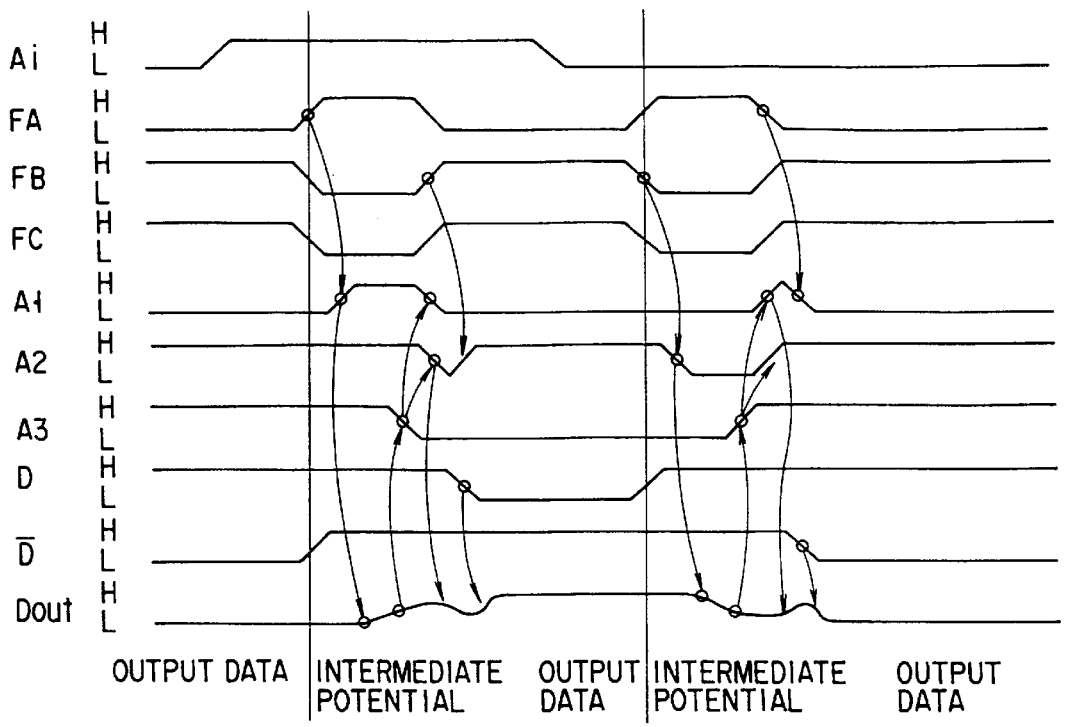
FIG. 11
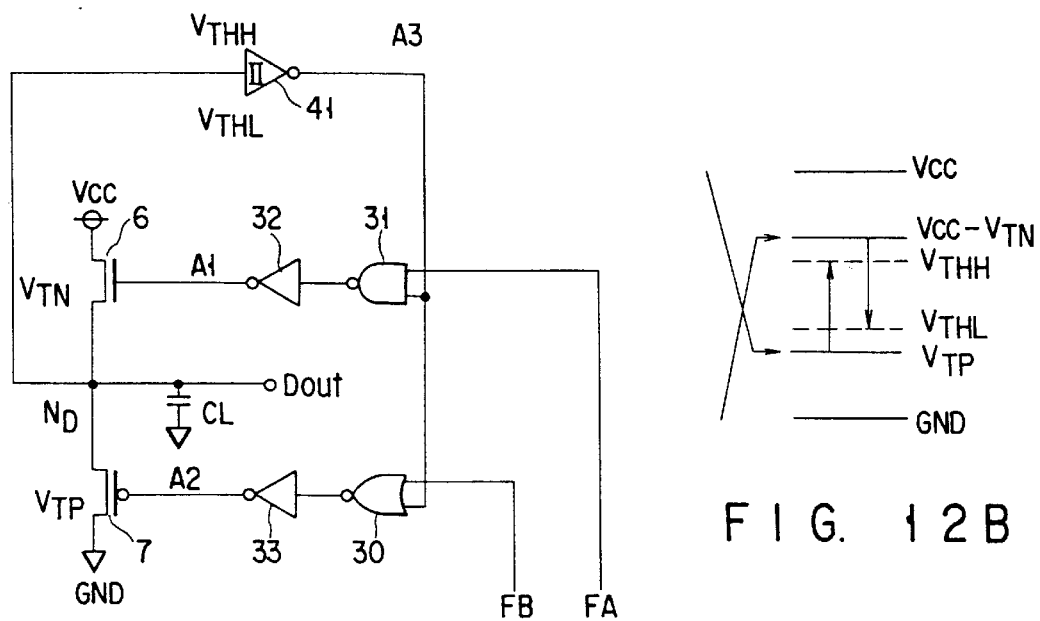
FIG. 12A
FIG. 12B

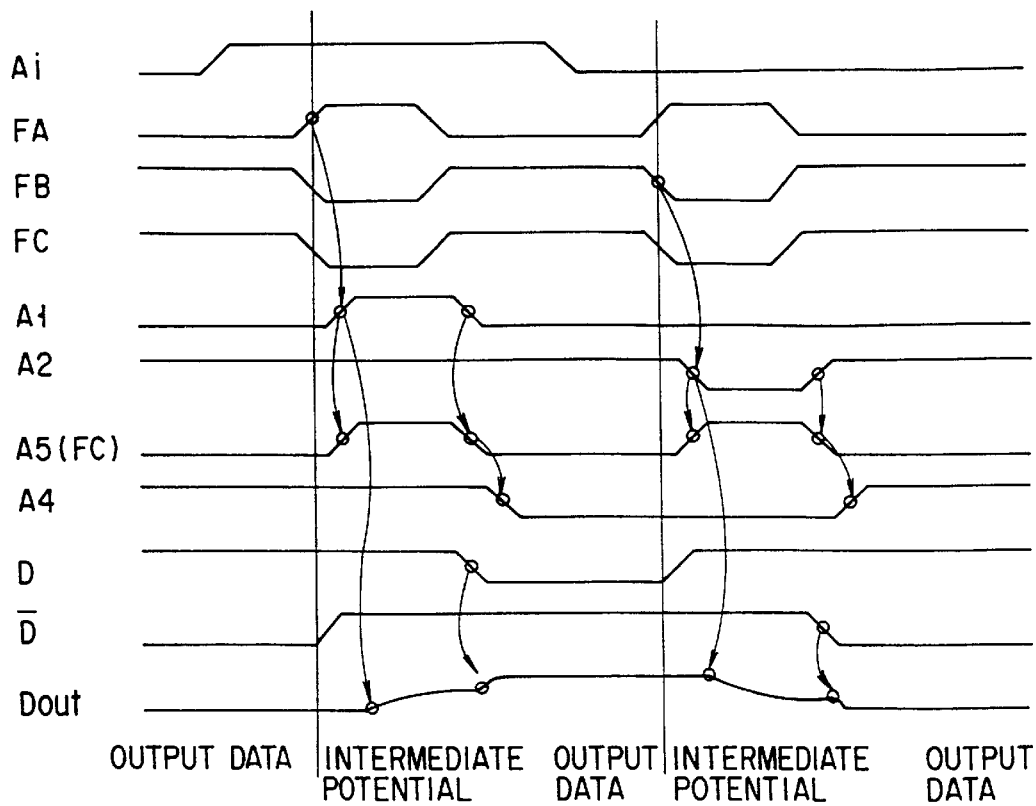
FIG. 21
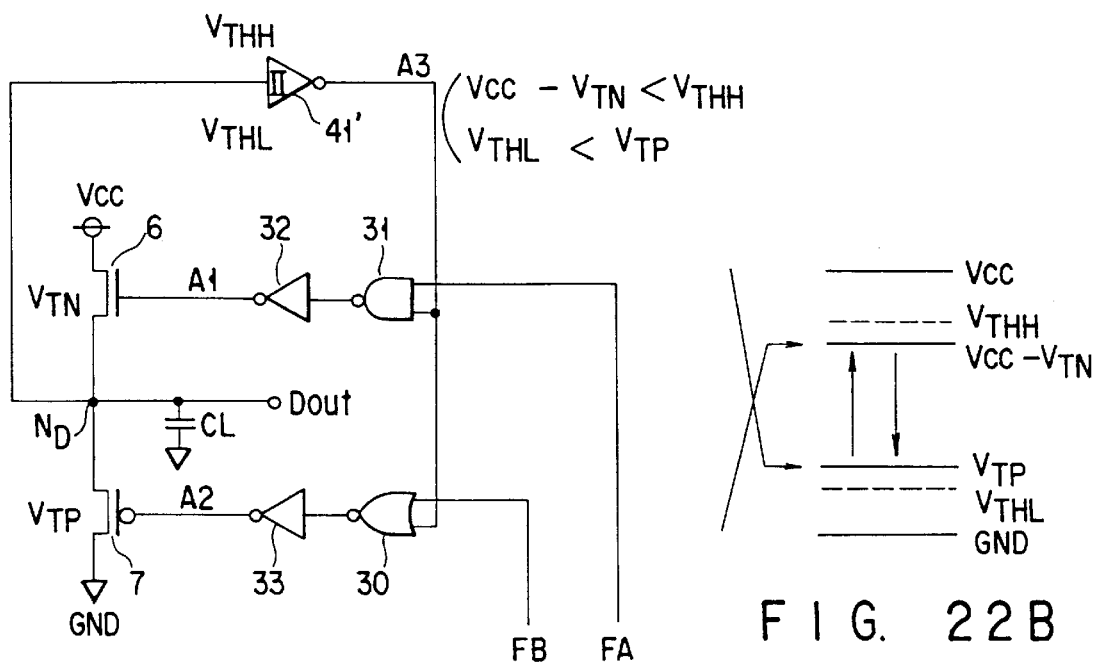
FIG. 22A
FIG. 22B

DATA OUTPUT CIRCUIT, INTERMEDIATE POTENTIAL SETTING CIRCUIT, AND SEMICONDUCTOR INTEGRATED CIRCUIT

This is a division of application Ser. No. 08/507,943, filed Jul. 27, 1995 now U.S. Pat. No. 5,698,994.

BACKGROUND OF THE INVENTION

1. Field of the Invention

The present invention relates a data output circuit for setting the output terminal of a semiconductor integrated circuit at a potential corresponding to a data signal, an intermediate potential setting circuit, and a semiconductor integrated circuit.

2. Description of the Related Art

In a semiconductor integrated circuit, when a data signal is to output outside from the output terminal, a large number of output buffers operate at once. When a large current flows in a power supply line upon this operation, considerable noise is produced because of the parasitic resistance and parasitic inductance of this power supply line. In addition, since each buffer must change the potential of the output terminal having a parasitic capacitor of a relatively large capacitance in accordance with the data signal, a change in the potential of the output terminal tends to delay with respect to the supply timing of the data signal.

FIG. 1 shows a conventional data output circuit designed to solve the above problem in a semiconductor memory device. This output circuit comprises an output buffer constituted by an n-channel MOSFET 150 connected between a power supply terminal VCC and an output terminal DOUT and an n-channel MOSFET 151 connected between a ground terminal GND and the output terminal DOUT, and a preset buffer constituted by an n-channel MOSFET 152 connected between a power supply terminal VCC and the output terminal DOUT and a p-channel MOSFET 153 connected between a ground terminal GND and the output terminal DOUT.

In this data output circuit, the preset buffer presets the potential of the output terminal to an intermediate level, e.g. VCC/2, in response to a signal ATD and its inverted signal which are generated in accordance with a change in an address signal, and the output buffer changes the potential of the output terminal from this intermediate level to VCC level or 0 level in accordance with a data signal DATA and its inverted signal. As a result, the potential of the output terminal can be set to VCC level or 0 level in a transition time shorter than the time required to change the potential from another level, e.g. 0 level or VCC level, to the other level. Such a data output circuit is disclosed in, for example, Jpn. Pat. Appln. Publication KOKAI No. 5-128873.

In the data output circuit shown in FIG. 1, when the potential of the output terminal DOUT is preset to the intermediate level, the transistors 152 and 153 of the preset buffer are set in a complete conducting state. As a result, a very large through current flows between the power supply terminal VCC and the ground terminal GND via these transistors. Consequently, the power consumption increases owing to this through current. In addition, the transistors 152 and 153 must drive a parasitic capacitor having a relatively large capacitance, which is formed in the output terminal DOUT, as a load. If the driving ability of the transistors 152 and 153 is made equal to that of the transistors 150 and 151 of the output buffer, a large occupied area is required. Furthermore, even if the driving ability of the transistors 152 and 153 is made equal to that of the transistors 150 and 151 of the output buffer, it is difficult to set the potential of the output terminal DOUT to the intermediate level within a short period of time.

FIG. 2 is a circuit diagram showing the arrangement of a conventional intermediate potential setting circuit. For example, an output circuit for restraining internal data from delaying at the output section is disclosed in "Semiconductor Integrated Circuit" in Jpn. Pat. Appln. Publication KOKAI No. 5-128873. In this semiconductor integrated circuit, an intermediate potential setting circuit is arranged to be isolated from an internal data output circuit. As shown in FIG. 2, in the conventional intermediate potential setting circuit, an n-channel MOSFET 6 and a p-channel MOSFET 7 are connected in series between a power supply Vcc and GND, and an external load capacitor CL is connected between the connection node of these transistors 6 and 7 and GND. An output Dout from the output terminal is obtained as the potential of the connection node. Signals A1 and A2 are respectively supplied to the gates of the n-channel MOSFET 6 and the p-channel MOSFET 7 to ON/OFF-controlling the respective FETS.

FIGS. 3A and 3B are timing charts for explaining the operation of the conventional intermediate potential setting circuit shown in FIG. 2. As shown in FIG. 3A, when the output Dout rises from L level of output data to the intermediate potential, the signal A1 changes from L level to H level to turn on the n-channel MOSFET 6. As a result, a charge current I2 flows from the power supply Vcc into the external load capacitor CL, and the output Dout from the output terminal changes from L level of the output level to the intermediate level in a transition time t1. As shown in FIG. 3A, when the output Dout falls from H level of output data to the intermediate potential, the signal A2 changes from H level to L level to turn on the p-channel MOSFET 7. As a result, a discharge current I3 flows out from the external load capacitor CL, and the output Dout of the output terminal changes from H level to the intermediate level in a transition time t1'.

In FIG. 3A, however, since the signal A2 also changes from H level to L level at the same time, the p-channel MOSFET 7 is also turned on at the same time. In FIG. 3B, since the signal A1 also changes from L level to H level at the same time, the n-channel MOSFET 6 is also turned on at the same time. The intermediate potential is kept on the basis of the ratio of the internal resistances of the n-channel MOSFET 6 and the p-channel MOSFET 7. As described above, since the two transistors are turned on at once, a large through current I1 flows from the power supply Vcc to GND. Owing to this through current I1, the power consumption increases. This problem is conspicuously posed in a CPU or a multi-bit memory device requiring a large number of output terminals. In addition, the transition times t1 and t1' are determined by the magnitudes of the charge and discharge currents I2 and I3. For this reason, it takes time to settle the output Dout from the output terminal at the intermediate potential, and hence the speed at which output data-is read out cannot be increased.

As described above, in the conventional intermediate potential setting circuit, when the potential of the output terminal is set at the intermediate potential between H level and L level, the p- and n-type FETs constituting the intermediate potential setting circuit are turned on at once. For this reason, the large through current I1 flows to increase the overall power consumption of the device. In addition, in consideration of this increase in power consumption and operating speed, it is difficult to apply the conventional intermediate potential setting circuit to a multi-bit memory and a high-speed memory.

SUMMARY OF THE INVENTION

It is an object of the present invention to provide a data output circuit for greatly reducing power consumed to preset the potential of an output terminal to an intermediate level.

It is another object of the present invention to solve the above problems and provide an intermediate potential setting circuit for reducing the power consumption and increasing the operating speed by reducing an through current, and a semiconductor integrated circuit which allows high-speed access to a semiconductor memory.

According to the present invention, there is provided a data output circuit comprising a reference potential terminal, a power supply potential terminal set at a potential higher than that of the reference potential terminal, an output terminal having a parasitic capacitor, a p-channel MOS transistor having a current path connected between the power supply potential terminal and the output terminal and a gate to which one of first and second complementary data signals is supplied, an n-channel MOS transistor having a current path connected between the reference potential terminal and the output terminal and a gate to which the other of the first and second complementary signals is supplied, and gate control means for feeding back a potential of the output terminal to the gates of the p- and n-channel MOS transistors to change the potential of the output terminal toward a predetermined intermediate level within a voltage range between the reference potential terminal and the power supply potential terminal before the first and second complementary data signals are supplied.

According to the present invention, there is provided an intermediate potential setting circuit comprising MOS transistors of first and second conductivity types connected in series between first and second reference power supplies, first and second gate control means, respectively connected to gates of the MOS transistors of the first and second conductivity types, for separately ON/OFF-controlling the MOS transistors of the first and second conductivity types, a load capacitor connected between a connection node of the MOS transistors of the first and second conductivity types and the second reference power supply, control means, connected between the connection node and the first and second gate control means, for feeding back a potential of the connection node to the first and second gate control means to selectively perform control to turn on the MOS transistors of the first and second conductivity types, external control means for externally supplying a control signal to the first and second gate control means, and an output terminal, connected to the connection node, for extracting an intermediate potential output as a potential of the load capacitor.

According to the present invention, there is provided an intermediate potential setting circuit comprising n- and p-channel MOSFETs connected in series between first and second reference power supplies, first and second gate control means, respectively connected to gates of the n- and p-channel MOSFETs, for separately ON/OFF-controlling the n- and p-channel MOSFETs, a load capacitor connected between a connection node of the n- and p-channel MOSFETs and the second reference power supply, inverter means, connected between the connection node and the first and second gate control means and having a predetermined threshold, for inverting and feeding back a potential of the connection node to the first and second gate control means to selectively perform control to turn on the n- and p-channel MOSFETs, external control means for externally supplying a control signal to the first and second gate control means, and an output terminal, connected to the connection node, for extracting an intermediate potential output as a potential of the load capacitor.

According to the present invention, there is provided a semiconductor integrated circuit comprising a semiconductor memory section constituted by a decoder circuit for decoding an externally input address signal, a memory array for storing data, and a signal amplification circuit for amplifying data from the memory array and outputting the data, a data output circuit, having an output terminal, for outputting the data output from the signal amplification circuit to the output terminal, an intermediate potential setting circuit, having n- and p-channel MOSFETs connected in series between first and second reference power supplies, for feeding back a potential of a connection node of the n- and p-channel MOSFETs connected to the output terminal to gates of the n- and p-channel MOSFETs through an inverter, thereby setting the output terminal to an intermediate potential between high and low potentials of the data during a period in which the data is not output, output circuit control means for generating a first control signal on the basis of the address signal to selectively cause the data output circuit and the intermediate potential setting circuit to operate, and pulse generating means for generating a second control signal on the basis of the address signal to selectively cause the n- and p-channel MOSFETs of the intermediate potential setting circuit to operate.

According to the present invention, there is provided an intermediate potential setting circuit comprising n- and p-channel MOSFETs connected in series between first and second reference power supplies, first and second gate control means, respectively connected to gates of the n- and p-channel MOSFETs, for separately ON/OFF-controlling the n- and p-channel MOSFETs, a load capacitor connected between a connection node of the n- and p-channel MOSEFTs and the second reference power supply, a Schmitt trigger circuit, connected between the connection node and the first and second gate control means and having high and low thresholds, for inverting and feeding back a potential of the connection node to the first and second gate control means to selectively perform control to turn on the n- and p-channel MOSFETs, external control means for externally supplying a control signal to the first and second gate control means, and an output terminal, connected to the connection node, for extracting an intermediate potential output as a potential of the load capacitor.

In addition, according to the present invention, there is provided a semiconductor integrated circuit comprising a semiconductor memory section constituted by a decoder circuit for decoding an externally input address signal, a memory array for storing data, and a signal amplification circuit for amplifying data from the memory array and outputting the data, a data output circuit, having an output terminal, for outputting the data output from the signal amplification circuit to the output terminal, an intermediate potential setting circuit, having n- and p-channel MOSFETs connected in series between first and second reference power supplies, for feeding back a potential of a connection node of the n- and p-channel MOSFETs connected to the output terminal to gates of the n- and p-channel MOSFETs through a Schmitt trigger circuit, thereby setting the output terminal to an intermediate potential between high and low potentials of the data during a period in which the data is not output, output circuit control means for generating a first control signal on the basis of the address signal to selectively cause the data output circuit and the intermediate potential setting circuit to operate, and pulse generating means for generating a second control signal on the basis of the address signal to selectively cause the n- and p-channel MOSFETs of the intermediate potential setting circuit to operate.

Furthermore, according to the present invention, there is provided an intermediate potential setting circuit comprising n- and p-channel MOSFETs connected in series between first and second reference power supplies, first and second gate control means, respectively connected to gates of the n- and p-channel MOSFETs, for separately ON/OFF-controlling the n- and p-channel MOSFETs, a load capacitor connected between a connection node of the n- and p-channel MOSEFTs and the second reference power supply, a flip-flop circuit, connected between the connection node and the first and second gate control means and having high and low thresholds, for feeding back a potential of the connection node to the first and second gate control means to selectively perform control to turn on the n- and p-channel MOSFETs, flip-flop circuit control means for controlling the flip-flop circuit to output an output signal once in accordance with a change in output from one of the first and second gate control means, external control means for externally supplying a control signal to the first and second gate control means, and an output terminal, connected to the connection node, for extracting an intermediate potential output as a potential of the load capacitor.

Moreover, according to the present invention, there is provided a semiconductor integrated circuit comprising a semiconductor memory section constituted by a decoder circuit for decoding an externally input address signal, a memory array for storing data, and a signal amplification circuit for amplifying data from the memory array and outputting the data, a data output circuit, having an output terminal, for outputting the data output from the signal amplification circuit to the output terminal, an intermediate potential setting circuit, having n- and p-channel MOSFETs connected in series between first and second reference power supplies, for feeding back a potential of a connection node of the n- and p-channel MOSFETs connected to the output terminal to gates of the n- and p-channel MOSFETs through a D flip-flop circuit and a control circuit therefor, thereby setting the output terminal to an intermediate potential between high and low potentials of the data during a period in which the data is not output, output circuit control means for generating a first control signal on the basis of the address signal to selectively cause the data output circuit and the intermediate potential setting circuit to operate, and pulse generating means for generating a second control signal on the basis of the address signal to selectively cause the n- and p-channel MOSFETs of the intermediate potential setting circuit to operate.

In the intermediate potential setting circuit of the present invention, the first gate control means is constituted by a two-input NAND circuit and an inverter which are connected in series, and the output terminal of the inverter is connected to the gate of the n-channel MOSFET. The second gate control means is constituted by a two-input NOR circuit and an inverter which are connected in series, and the output terminal of the inverter is connected to the gate of the p-channel MOSFET. When the potential of the connection node exceeds a threshold, the inverter means supplies an output signal obtained by inverting an input signal to the firs and second gate control means. Under the control of the first and second gate control means controlled by the external control means, only the n-channel MOSFET is turned on by an H-level output from the inverter means, and only the p-channel MOSFET is turned on by an L-level output from the inverter means. The Schmitt trigger circuit has high and lower thresholds. The high threshold of the Schmitt trigger circuit is set to be lower than a high intermediate potential, and the lower threshold is set to be lower than a low intermediate potential. When the potential of the connection node is to be raised, an output from the Schmitt trigger circuit which is obtained by the high threshold is supplied to the first and second gate control means. When the potential of the connection node is to be lowered, an output from the Schmitt trigger circuit which is obtained by the low threshold is supplied to the first and second gate control means. Under the control of the first and second gate control means controlled by the external control means, only the n-channel MOSFET is turned on by an H-level output from the Schmitt trigger circuit, and only the p-channel MOSFET is turned on by an L-level output from the Schmitt trigger circuit.

In the semiconductor integrated circuit of the present invention, the intermediate potential setting circuit comprises n- and p-channel MOSFETs connected in series between first and second reference power supplies, first and second gate control means, respectively connected to gates of the n- and p-channel MOSFETs, for separately ON/OFF-controlling the n- and p-channel MOSFETs, a load capacitor connected between a connection node of the n- and p-channel MOSEFTs and the second reference power supply, inverter means, connected between the connection node and the first and second gate control means and having a predetermined threshold, for inverting and feeding back a potential of the connection node to the first and second gate control means to selectively perform control to turn on the n- and p-channel MOSFETs, and an output terminal, connected to the connection node, for extracting an intermediate potential output as a potential of the load capacitor. The first gate control means is constituted by a three-input NAND circuit and an inverter, and the output terminal of the inverter is connected to the gate of the n-channel MOSFET. The second gate control means is constituted by a three-input NOR circuit and an inverter, and the output terminal of the inverter is connected to the gate of the p-channel MOSFET. When the potential of the connection node exceeds a threshold, the inverter means supplies an output signal obtained by inverting an input signal to the first and second gate control means. Under the control of the first and second gate control means controlled by the external control means, only the n-channel MOSFET is turned on by an H-level output from the inverter means, and only the p-channel MOSFET is turned on by an L-level output from the inverter means. In addition, the intermediate potential setting circuit comprises n- and p-channel MOSFETs connected in series between first and second reference power supplies, first and second gate control means, respectively connected to gates of the n- and p-channel MOSFETs, for separately ON/OFF-controlling the n- and p-channel MOSFETs, a load capacitor connected between a connection node of the n- and p-channel MOSEFTs and the second reference power supply, a Schmitt trigger circuit, connected between the connection node and the first and second gate control means and having high and low thresholds, for inverting and feeding back a potential of the connection node to the first and second gate control means to selectively perform control to turn on the n- and p-channel MOSFETs, and an output terminal, connected to the connection node, for extracting an intermediate potential output as a potential of the load capacitor. The Schmitt trigger circuit has high and lower thresholds. The high threshold of the Schmitt trigger circuit is set to be lower than a high intermediate potential, and the lower threshold is set to be lower than a low intermediate potential. When the potential of the connection node is to be raised, an output from the Schmitt trigger circuit which is obtained by the high threshold is supplied to the first and second gate control means. When the potential of the connection node is to be lowered, an output from the Schmitt trigger circuit which is obtained by the low threshold is supplied to the first and second gate control means. Under the control of the first and second gate control means controlled by the external control means, only the n-channel MOSFET is turned on by an H-level output from the Schmitt trigger circuit, and only the p-channel MOSFET is turned on by an L-level output from the Schmitt trigger circuit. The flip-flop circuit inverts an input signal in accordance with a signal from the flip-flop circuit control means, and supplies the inverted signal to the first and second gate control means. Under the control of the first and second gate control means controlled by the external control means, only the n-channel MOSFET is turned on by an H-level output from the flip-flop circuit, and only the p-channel MOSFET is turned on by an L-level output from the flip-flop circuit. Furthermore, the intermediate potential setting circuit comprises n- and p-channel MOSFETs connected in series between first and second reference power supplies, first and second gate control means, respectively connected to gates of the n- and p-channel MOSFETs, for separately ON/OFF-controlling the n- and p-channel MOSFETs, a load capacitor connected between a connection node of the n- and p-channel MOSEFTs and the second reference power supply, a flip-flop circuit, connected between the connection node and the first and second gate control means and having high and low thresholds, for feeding back a potential of the connection node to the first and second gate control means to selectively perform control to turn on the n- and p-channel MOSFETs, flip-flop circuit control means for controlling the flip-flop circuit to output an output signal once in accordance with a change in output from one of the first and second gate control means, and an output terminal, connected to the connection node, for extracting an intermediate potential output as a potential of the load capacitor. The flip-flop circuit inverts an input signal in accordance with a signal from the flip-flop circuit control means, and supplies the inverted signal to the first and second gate control means. Under the control of the first and second gate control means controlled by the external control means, only the n-channel MOSFET is turned on by an H-level output from the flip-flop circuit, and only the p-channel MOSFET is turned on by an L-level output from the flip-flop circuit.

In the data output circuit of the present invention, the gate control circuit feeds back the potential of the output terminal to the gates of the p- and n-channel MOS transistors before the first and second complementary data signals are supplied. Immediately after the potential of the output terminal is fed back, the difference in degree of conduction between the p- and n-channel MOS transistors is large. For this reason, the parasitic capacitor is mainly charged by one of the transistors at a high speed. As the potential of the output terminal approaches a predetermined intermediate level, the p- and n-channel MOS transistors are set in a weak conducting state. This prevents a large through current from flowing between the reference potential terminal and the power supply potential terminal via the p- and n-channel MOS transistors. Therefore, the potential of the output terminal can be preset to the predetermined intermediate level without considerably consuming power. In addition, the gate control circuit need not charge/discharge the parasitic capacitor of the output terminal, and hence does not occupy such a large area as that occupied by the p- and n-channel MOS transistors.

In the intermediate potential setting circuit, when the output terminal is to set to the intermediate potential, the potential of the output terminal changed in a reverse direction to the potential of data read out in the preceding cycle. That is, only one of the p- and n-channel MOSFETs is turned on. With this operation, the through current can be reduced, and hence the power consumption can be reduced. In addition, the operation speed can be increased. Furthermore, owing to the circuit arrangement, the output terminal may oscillate depending on the capacitance of the external load capacitor and the pulse widths of the intermediate potential control signals $F_A$ and $F_B$. However, this circuit includes a circuit for suppressing this oscillation. In the semiconductor integrated circuit, the memory access time can be shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 11 is a timing chart for explaining the operation of the first embodiment of the semiconductor integrated circuit in FIG. 10;

FIG. 12A is a circuit diagram showing the arrangement of the fourth embodiment of the present invention, which corresponds to the second embodiment of the intermediate potential setting circuit of the present invention;

FIG. 12B is a timing chart for explaining the operation of the circuit shown in FIG. 12A;

FIG. 21 is a timing chart for explaining the operation of the third embodiment of the semiconductor integrated circuit;

FIG. 22A is a circuit diagram for explaining the schematic arrangement and operation of the eighth embodiment of the present invention, which corresponds to the fourth embodiment of the intermediate potential setting circuit of the present invention;

FIG. 22B is a timing chart for explaining the operation of the circuit shown in FIG. 22A;

DETAILED DESCRIPTION OF THE PREFERRED EMBODIMENTS

Embodiments of the present invention will be described below with reference to the accompanying drawings.

(First Embodiment)

Figure 4:
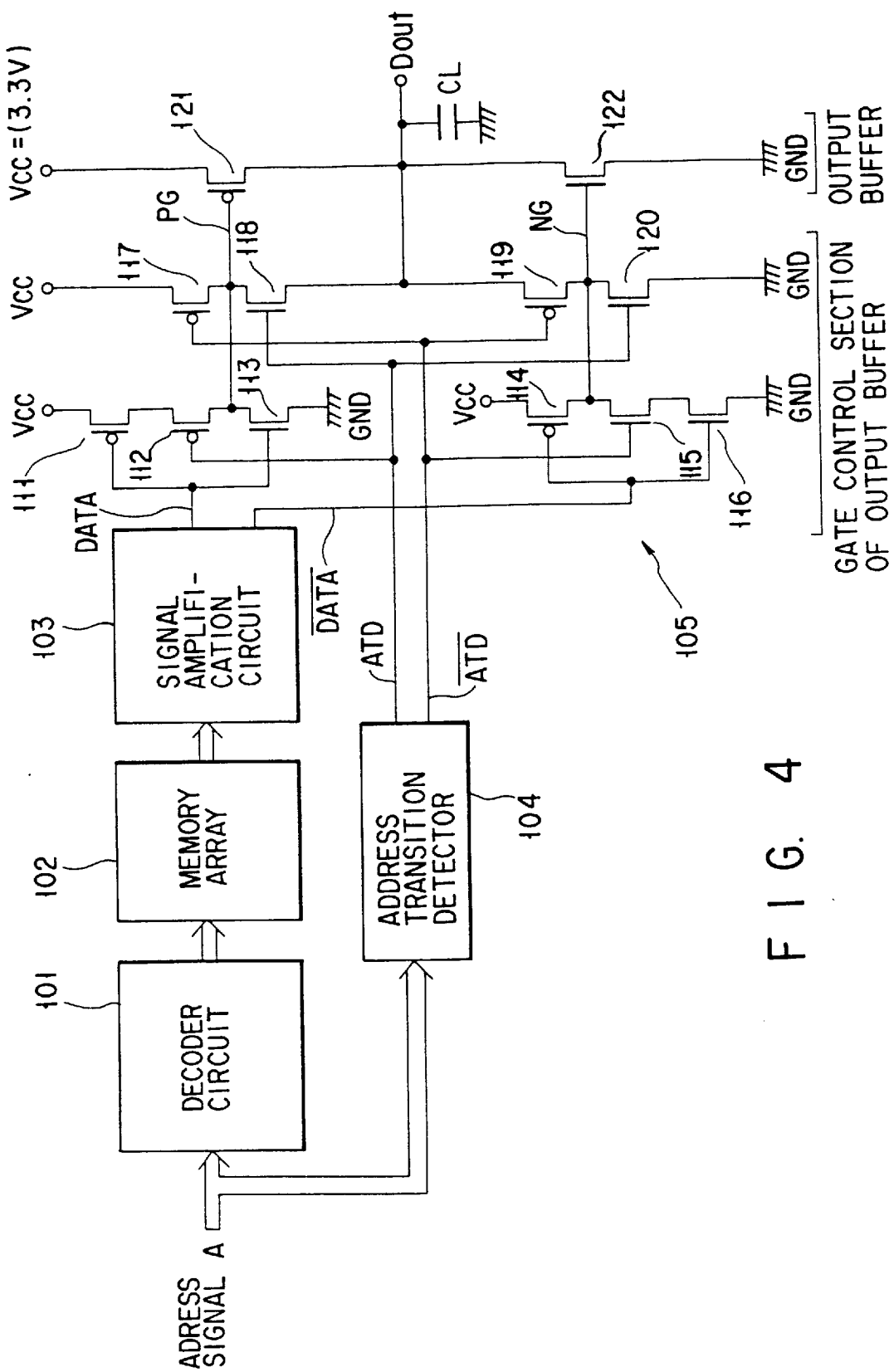
FIG. 4 is a circuit diagram showing the circuit arrangement of a semiconductor memory device according to the first embodiment of the present invention.

FIG. 4 schematically shows the circuit arrangement of a semiconductor memory device according to the first embodiment of the present invention. This semiconductor memory device comprises a decoder circuit 101, a memory array 102, a signal amplification circuit 103, an address transition detector 104, and a data output circuit 105. The decoder circuit 1 decodes an address signal A to supply a selection signal to the memory array 102. The memory array 102 is constituted by a plurality of pairs of static memory cells. Data is read out from each of a pair of memory cells selected by a selection signal from the decoder circuit 101, and two signals having a potential difference corresponding to the readout data are supplied to the signal amplification circuit 103. The signal amplification circuit 103 amplifies these two signals and generates a data signal DATA and a data signal $\overline{DATA}$ exhibiting a complementary relationship in accordance with the potential difference between the two signals after the elapse of a predetermined equalization period starting from the beginning of the data read operation. In the equalization period, the data signal DATA is kept at low level, and the data signal $\overline{DATA}$ is kept at high level. Assume that data "1" is read out. In this case, after the elapse of the equalization period, the data signal DATA changes from low level to high level while the data signal $\overline{DATA}$ is kept at high level. Assume that data "0" is read out. In this case, after the elapse of the equalization period, the data signal $\overline{DATA}$ changes from high level to low level while the data signal DATA is kept at low level.

The address transition detector 104 detects a change in the address signal A upon an update operation, and generates an change detection pulse signal ATD which rises at this detection timing and is kept at high level for a period equal to the above equalization period, together with an change detection pulse signal $\overline{ATD}$ which is complementary to the pulse signal ATD. The data output circuit 105 sets an output terminal DOUT at a potential corresponding to the data signals DATA and $\overline{DATA}$ under the control of the change detection pulse signals ATD and $\overline{ATD}$ from the signal amplification circuit 103. The output terminal DOUT is used to connect the semiconductor memory device to an external unit and has a parasitic capacitor CL having a considerably large capacitance.

As shown in FIG. 4, the data output circuit 105 comprises a gate control section 106 constituted by a p-channel MOS transistors 111, 112, 114, 117, and 119 and n-channel MOS transistors 113, 115, 116, 118, and 120, and a CMOS output buffer 107 constituted by a p-channel MOS transistor 121 and an n-channel MOS transistor 122.

The current paths of the transistors 111, 112, and 113 are connected in series between a power supply terminal VCC, which is set at a power supply potential of 3.3V, and a ground terminal GND, which is set at a reference potential of 0V. The current paths of the transistors 114, 115, and 116 are connected in series between a power supply terminal VCC and a ground terminal GND. The current paths of the transistors 117, 118, 119, and 120 are connected in series between a power supply terminal VCC and a ground terminal GND. The connection point of the transistors 112 and 113 is connected to the connection point of the transistors 117 and 118. The connection point of the transistors 114 and 115 is connected to the connection point of the transistors 119 and 120. The connection point of the transistors 118 and 119 is connected to the output terminal DOUT. The gates of the transistors 111 and 113 are connected to the signal amplification circuit 103 to receive the data signal DATA. The gates of the transistors 114 and 116 are connected to the signal amplification circuit 103 to receive the data signal $\overline{\text{DATA}}$. The gates of the transistors 112, 118, and 120 are connected to the address transition detector 104 to receive the transition detection pulse signal ATD. The gates of the transistors 115, 117, and 119 are connected to the address transition detector 104 to receive the transition detection pulse signal $\overline{\text{ATD}}$.

The current path of the transistor 121 is connected between the power supply terminal VCC and the output terminal DOUT. The current path of the transistor 122 is connected between the output terminal DOUT and the ground terminal GND. The gate of the transistor 121 is connected to the connection point of the transistors 117 and 118. The gate of the transistor 122 is connected to the connection point of the transistors 119 and 120. The driving ability of the transistors 111 to 120 is set to be much lower than that of the transistors 121 and 122.

In the output buffer 107, the transistor 121 charges the parasitic capacitor CL of the output terminal DOUT when a gate potential PG drops, and the transistor 122 discharges the parasitic capacitor CL of the output terminal DOUT when a gate potential NG rises. The gate control section 106 feeds back the potential of the output terminal DOUT to the gates of the transistors 121 and 122 to change the potential of the output terminal DOUT toward VCC/2, i.e., the intermediate level, when the transition detection pulse signal ATD rises and the change detection pulse signal $\overline{\text{ATD}}$ falls. In addition, the gate control section 106 supplies an inverted signal of the data signal DATA and an inverted signal of the data signal $\overline{\text{DATA}}$, respectively, to the gates of the transistors 121 and 122 to change the potential of the output terminal DOUT from the intermediate level to high level VOH (=2.4V) or low level VOL (=0.4V) when the transition detection pulse signal ATD falls and the change detection pulse signal $\overline{\text{ATD}}$ rises.

The operation of this semiconductor memory device will be described next.

Figure 5:
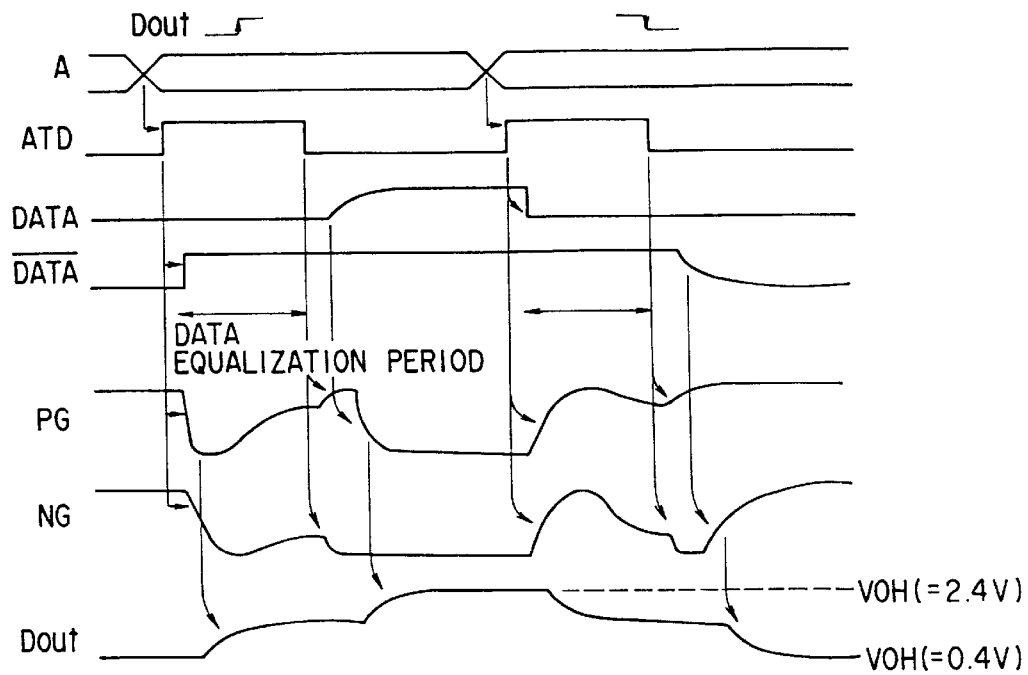
FIG. 5 is a timing chart for explaining the operation of the semiconductor memory device in FIG. 4.

As shown in FIG. 5, when the address signal A is updated, the decoder circuit 101 supplies a selection signal corresponding to the updated address signal A to the memory array 102. The memory array 102 reads out data from a pair of memory cells selected by this selection signal, and supplies two signals having a potential difference corresponding to the readout data to the signal amplification circuit 103. The signal amplification circuit 103 amplifies the two signals and generates the data signal DATA and the data signal $\overline{\text{DATA}}$ exhibiting a complementary relationship in accordance with the potential difference between the two signals after the elapse of a predetermined equalization period starting from the beginning of the data read operation. Meanwhile, the address transition detector 104 detects the transition in the address signal A to cause the change detection pulse signal ATD to rise. This transition detection pulse signal ATD is kept at high level for a period equal to the above equalization period.

In the equalization period after the transition detection pulse signal ATD rises and the transition detection pulse signal $\overline{\text{ATD}}$ falls, the data signal DATA is set at low level, and the data signal $\overline{\text{DATA}}$ is set at high level. As a result, the transistors 112, 113, 114, and 115 are set in an OFF state, and both the connection point of the transistors 112 and 113 and the connection point of the transistors 114 and 115 are set in an electrically floating state. In contrast to this, in this equalization period, the transistors 117, 118, 119, and 120 are set in an ON state, so that the gate potential PG of the transistor 121 and the gate potential NG of the transistor 122 are determined by the transistors 117, 118, 119, and 120. That is, the gate potential PG of the transistor 121 is set to a level obtained by dividing the voltage between the power supply terminal VCC and the output terminal DOUT by the ratio of the ON resistances of the transistors 117 and 118. The gate potential PG of the transistor 122 is set to a level obtained by dividing the voltage between the output terminal DOUT and the ground terminal GND by the ratio of the ON resistances of the transistors 119 and 120. The transistors 117, 118, 119, and 120 do not have a high driving ability, unlike the transistors 121 and 122. For this reason, the transistors 121 and 122 substantially charge/discharge the parasitic capacitor of the output terminal DOUT in place of the transistors 117, 118, 119, and 120. If, for example, the potential of the output terminal DOUT is at low level, the transistor 121 is turned on to raise the potential of the output terminal DOUT to the intermediate level. In contrast to this, if the potential of the output terminal DOUT is at high level, the transistor 122 is turned on to lower the potential of the output terminal DOUT to the intermediate level. When the potential of the output terminal DOUT reaches the intermediate level, both the transistors 121 and 122 are set in a weak conducting state to keep the potential of the output terminal DOUT at the intermediate level.

The address transition detector 104 sets the change detection pulse signal ATD to low level after the potential of the output terminal DOUT is present to the intermediate level in the above manner. When the change detection pulse signal ATD falls, all the transistors 117, 118, 119, and 120 are set in an OFF state, and the transistors 112 and 115 are set in an ON state. As a result, an inverted signal of the data signal DATA is supplied from the connection point of the transistors 112 and 113 to the gate of the p-channel MOS transistor 121, and an inverted signal of the data signal $\overline{\text{DATA}}$ is supplied from the connection point of the transistors 114 and 115 to the gate of the n-channel MOS transistor 122.

If, for example, the data signal DATA changes toward high level in accordance with readout data "1", the transistor 113 is turned on, and the transistor 121 is set in a complete conducting state. At this time, since the data signal $\overline{\text{DATA}}$ is kept at high level, the transistor 116 is turned on, and the transistor 122 is set in a complete OFF state. As a result, the potential of the output terminal DOUT changes from the intermediate level to high level. In contrast to this, when the data signal $\overline{\text{DATA}}$ changes toward low level in accordance with readout data "0", the transistor 114 is turned on, and the transistor 122 is set in a complete conducting state. At this time, since the data signal DATA is kept at low level, the transistor 111 is turned on, and the transistor 121 is set in a complete OFF state. As a result, the potential of the output terminal DOUT changes from the intermediate level to low level.

In the first embodiment, the CMOS output buffer 107 is also used as a preset buffer for presetting the output terminal DOUT to a predetermined intermediate level. For this reason, the gate control section 106 feeds back the potential of the output terminal DOUT to the p- and n-channel MOS transistors 121 and 122 before the data signals DATA and $\overline{\text{DATA}}$ obtained from the signal amplification circuit 103 have a complementary relationship dependent on readout data. Since the difference in degree of conduction between the p- and n-channel MOS transistors 121 and 122 is large immediately after the potential of the output terminal DOUT is fed back, the parasitic capacitor CL is mainly charged/discharge via one of these transistors 121 and 122 at a high speed. As the potential of the output terminal DOUT approaches the predetermined intermediate level, the p- and n-channel MOS transistors 121 and 122 is set in a weak conducting state. This prevents a large through current from flowing between the power supply terminal VCC and the ground terminal GND via the p- and n-channel transistors. Therefore, the potential of the output terminal DOUT can be preset to the predetermined intermediate level without considerably consuming power. The preset speed can be set to be much higher than that in the case wherein the potential of the output terminal DOUT is not fed back.

All the transistors 117, 118, 119, and 120 are turned on to feed back the potential of the output terminal DOUT to the gates of the transistors 121 and 122. However, since these transistors 117, 118, 119, and 120 have only a driving ability enough to charge/discharge the parasitic capacitors of the gates of the transistors 121 and 122, the through current flowing between the power supply terminal VCC and the ground terminal GND via the transistors 117 to 120 can be sufficiently reduced. In addition, since the transistors 111 to 120 require no such a high driving ability as that of the transistors 121 and 122, the occupied area can be set to be much smaller than that in the case wherein a preset buffer is arranged independently of the output buffer 107 to charge/discharge the parasitic capacitor CL of the output terminal DOUT, leading to a great contribution to a reduction in manufacturing cost.

Furthermore, since the ratio at which the potential of the output terminal DOUT is fed back to the gates of the transistors 121 and 122 can be adjusted by the ON resistances of the transistors 117 to 120, the potential of the output terminal DOUT can be easily set to an intermediate level suitable for an external unit to be connected to the output terminal DOUT.

The present invention is not limited to the above embodiment. Various changes and modifications of the embodiment can be made without departing from the spirit and scope of the present invention. In general, setting of the intermediate level to (VOH+VOL)/2 is the basis for minimizing the potential transition time. For this reason, in the above embodiment, the intermediate level is preset to VCC/2. When, however, a TTL-level output is to be obtained, the intermediate level must be set to 1.5V with respect to VCC=5. In such a case, for example, the above data output circuit 105 can be modified as shown in FIG. 6.

Figures 6, 7:
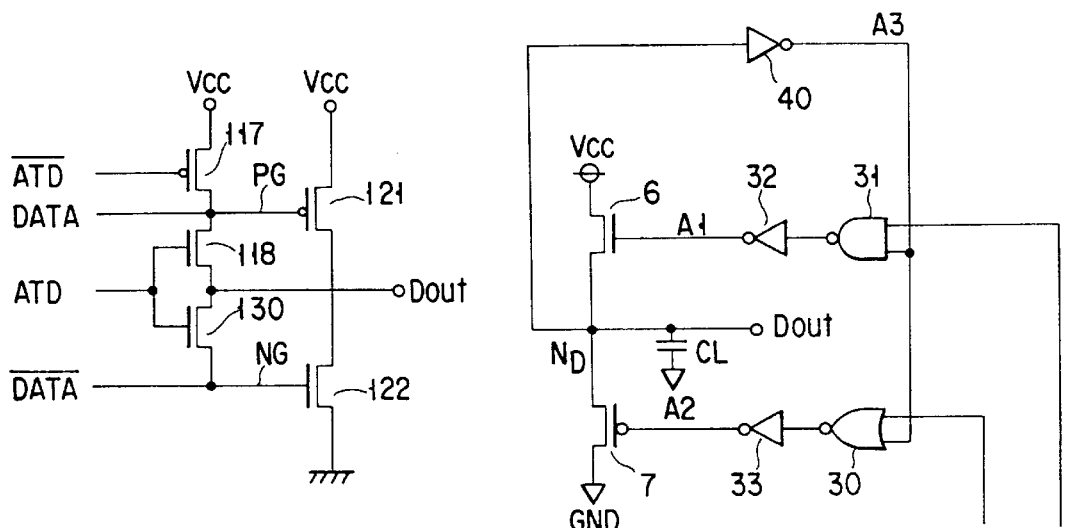
FIG. 6 is a circuit diagram showing the circuit arrangement of a modification of a data output circuit in FIG. 4.
FIG. 7 is a circuit diagram showing the arrangement of the second embodiment of the present invention, which corresponds to the first embodiment of the intermediate potential setting circuit of the present invention.

In this modification in FIG. 6, the p-channel MOS transistor 119 shown in FIG. 4 is replaced with an n-channel MOS transistor 130, and the n-channel MOS transistor 120 shown in FIG. 4 is omitted. In addition, the gate of the n-channel MOS transistor 130 is connected to receive a transition detection pulse signal, and the current path is connected between the output terminal DOUT and the gate of the n-channel MOS transistor 122. With this arrangement, the driving ability of the transistor 122 can be set to be higher than that of the transistor 121 without decreasing the gate potential NG of the transistor 122.

According to the first embodiment, the power consumed to preset the potential of the output terminal to the intermediate level can be greatly reduced.

(Second Embodiment)

FIG. 7 is a circuit diagram showing the arrangement of the second embodiment of the present invention, which corresponds to the first embodiment of the intermediate potential setting circuit of the present invention. An n-channel MOSFET 6 and a p-channel MOSFET 7 are connected in series between two reference power supplies Vcc and GND. An external load capacitor CL is connected between a connection node $N_D$ of these transistors and the reference power supply GND. The external load capacitor CL is constituted by a parasitic capacitor. An output Dout from the output terminal is obtained as the potential of the connection node $N_D$. In the second embodiment, a series circuit of a two-input NAND circuit 31 and an inverter 32 is connected to the gate of the n-channel MOSFET 6. A series circuit of a two-input NOR circuit 30 and an inverter 33 is connected to the gate of the p-channel MOSFET 7. Output signals A1 and A2 are respectively supplied from the inverters 32 and 33 to the n-channel MOSFET 6 and the p-channel MOSFET 7 to ON/OFF-control the respective FETs. An inverter 40 is connected between the connection node $N_D$, one input terminal of the two-input NAND circuit 31, and one input terminal of the two-input NOR circuit 30 to feed back the potential of the connection node $N_D$ to the two-input NAND circuit 31 and the two-input NOR circuit 30. The inverter 40 has a predetermined threshold VTH. Intermediate potential control signals $F_A$ and $F_B$ from an external pulse generating circuit (not shown) are respectively supplied to the other input terminal of the two-input NAND circuit 31 and the other input terminal of the two-input NOR circuit 30.

Figure 8:
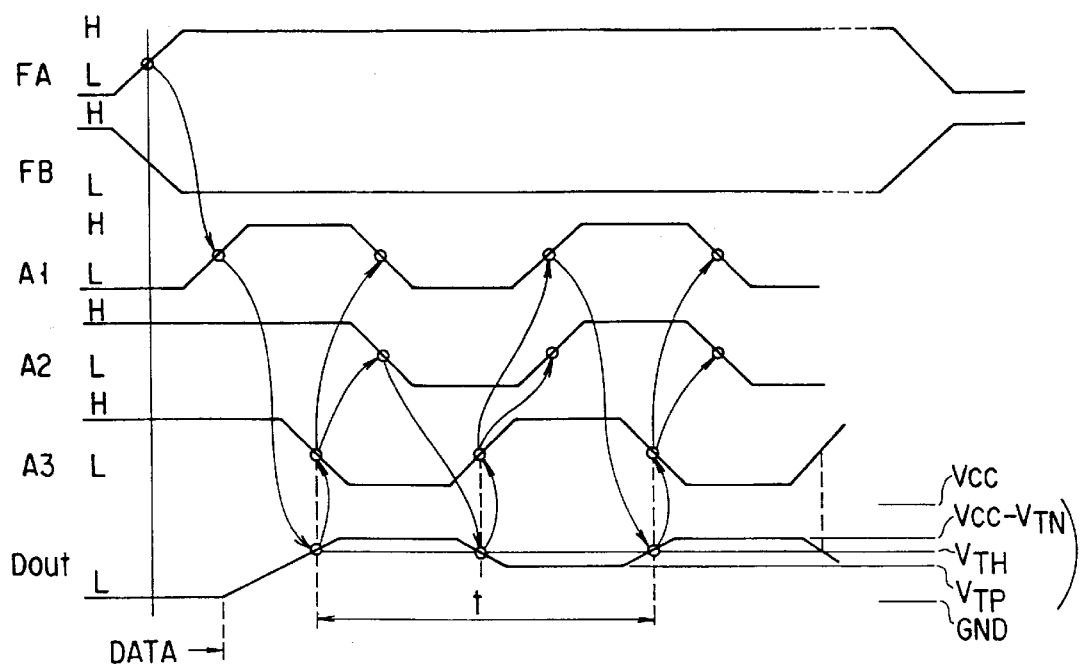
FIG. 8 is a timing chart for explaining the operation of the first embodiment of the intermediate potential setting circuit in FIG. 7 in a case wherein an output Dout from the output terminal changes from L level to an intermediate potential.
Figure 9:
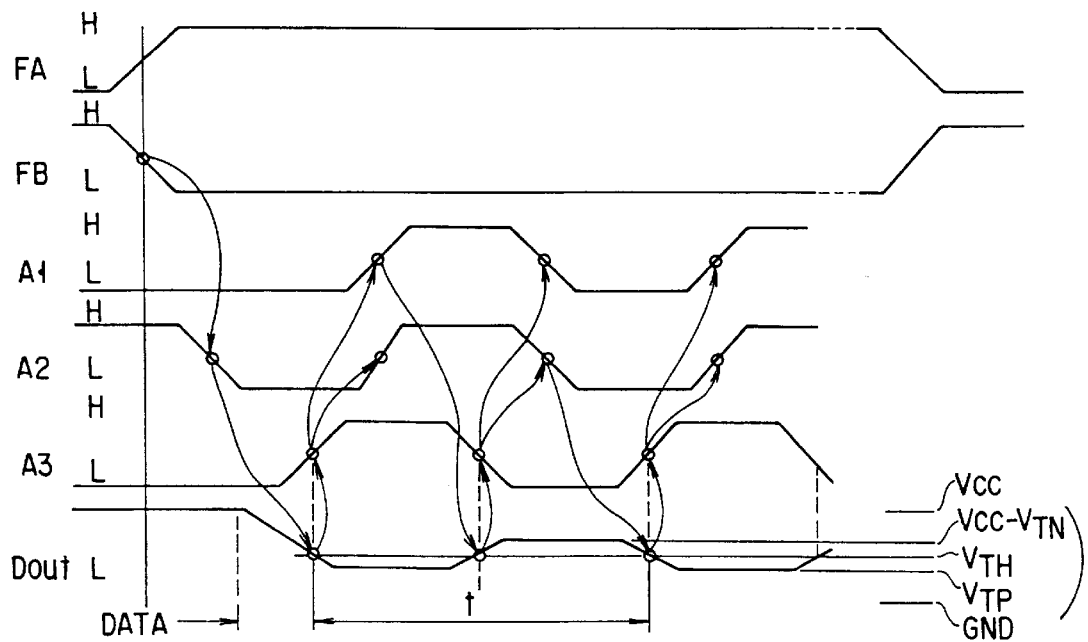
FIG. 9 is a timing chart for explaining the operation of the first embodiment of the intermediate potential setting circuit in FIG. 7 in a case wherein the output Dout from the output terminal changes from H level to the intermediate potential.

FIGS. 8 and 9 are timing charts for explaining the operation of the first embodiment of the intermediate potential setting circuit in FIG. 7. FIG. 8 shows a case wherein the potential of the connection node $N_D$, i.e., the output Dout from the output terminal, is at L level. Since the potential of the connection node $N_D$ is at L level, the potential of a signal A3 is inverted by the inverter 40 and set at H level. When the external pulse generating circuit changes the intermediate potential control signal $F_A$ from L level to H level, and changes the intermediate potential control signal $F_B$ from H level to L level, the two-input NAND circuit 31 and the two-input NOR circuit 30 are enabled. Both the potentials of the intermediate potential control signal $F_A$ and the signal A3 are at L level, but the potential of the output signal A1 is raised from L level to H level by the inverter 32. However, the intermediate potential control signal $F_B$ is at L level, and the potential of the signal A3 is at H level. Consequently, the output from the NOR circuit 30 is at L level, and the potential of the output signal A2 is kept at H level by the inverter 33. For this reason, the n-channel MOSFET 6 is in an ON state, but the p-channel MOSFET 7 is kept in an OFF state. As a result, the potential of the output Dout from the output terminal is raised from L level to intermediate potential VCC–$V_{TN}$, exceeding the threshold VTH of the inverter 40, by the n-channel MOSFET 6, if the threshold of the n-channel MOSFET 6 is set to be a threshold $V_{TN}$. At this time, the output from the inverter 40, i.e., the signal A3, changes from H level to L level, and hence both the output signals A1 and A2 are inverted. As a result, the n-channel MOSFET 6 is turned off, but the p-channel MOSFET 7 is turned on. Therefore, the potential of the output Dout of the output terminal is lowered from the intermediate potential VCC–$V_{TN}$ to the threshold $V_{TP}$, exceeding the threshold VTH of the inverter 40, by the p-channel MOSFET 7 if the threshold of the p-channel MOSFET 7 is set to be a -threshold $V_{TP}$. At this time, the output from the inverter 40, i.e., the signal A3, changes from L level to H level. As a result, both the signals A1 and A2 are inverted again. Subsequently, a similar operation is repeated until the intermediate potential control signals $F_A$ and $F_B$ are inverted.

FIG. 9 shows a case wherein the potential of the connection node $N_D$, i.e., the output Dout of the output terminal, is at H level, and H-level data is output, as readout data in the preceding cycle, to the output terminal Dout. Since the potential of the connection node $N_D$ is at H level, the potential of the signal A3 is inverted to be set at L level by the inverter 40. Since the potential of the connection node $N_D$ is at H level, the potential of the signal A3 is inverted to be set at L level by the inverter 40. In this case, the external pulse generating circuit changes the intermediate potential control signal $F_A$ from L level to H level, and changes the intermediate potential control signal $F_B$ from H level to L level. As a result, the two-input NAND circuit 31 and the two-input NOR circuit 30 are enabled. Since both the potentials of the intermediate potential control signal $F_B$ and the signal A3 are at L level, the output from the two-input NOR circuit 30 is H level. However, the potential of the output signal A2 is lowered from H level to L level by the inverter 32. Since the intermediate potential control signal $F_A$ is at H level, and the potential of the signal A3 is at L level, the output from the NAND circuit 31 is at H level, and the potential of the output signal A1 is fixed to L level by the inverter 32. For this reason, the p-channel MOSFET 7 is turned on, but the n-channel MOSFET 6 is kept off. Therefore, the potential of the output Dout from the output terminal is lowered from H level to the intermediate potential $V_{TP}$, exceeding the threshold VTH of the inverter 40, by the p-channel MOSFET 7. That is, if the threshold of the p-channel MOSFET 7 is set to be the intermediate potential $V_{TP}$, the potential of the output Dout from the output terminal is lowered to the intermediate potential $V_{TP}$. At this time, the output from the inverter 40, i.e., the signal A3, changes from L level to H level, and hence both the signals A1 and A2 are inverted. As a result, the p-channel MOSFET 7 is turned off, but the n-channel MOSFET 6 is turned on. Consequently, the output Dout from the output terminal is raised from the intermediate potential $V_{TP}$ to the intermediate potential VCC–$V_{TN}$, exceeding the threshold VTH of he inverter 40, by the n-channel MOSFET 6. At this time, the output from the inverter 40, i.e., the signal A3, changes from H level to L level. As a result, both the signals A1 and A2 are inverted again. Subsequently, a similar operation is repeated until the intermediate potential control signals $F_A$ and $F_B$ are inverted.

As described above, if the output Dout from the output terminal is directly changed from H level to L level or from L level to H level, this change takes much time, and the output data delays at the output section. In order to suppress this delay, the intermediate potential setting circuit changes the potential of the output terminal in the reverse direction to the potential of the output data in changing the potential of the output data from the output terminal from H level or L level to the intermediate potential.

According to the second embodiment, since only one of the n-channel MOSFET 6 and the p-channel MOSFET 7 is turned on to set the output terminal to the intermediate potential, a through current can be prevented from flowing. In addition, since no inflow flows, the charge current supplied to the external load capacitor can be increased to allow a high-speed charging operation. For this reason, the time for a transition to the intermediate potential can be shortened as compared with the prior art, and the potential of the output terminal can be quickly set to the intermediate potential. Furthermore, since no through current flows, the power consumption can be reduced.

(Third Embodiment)

Figure 10:
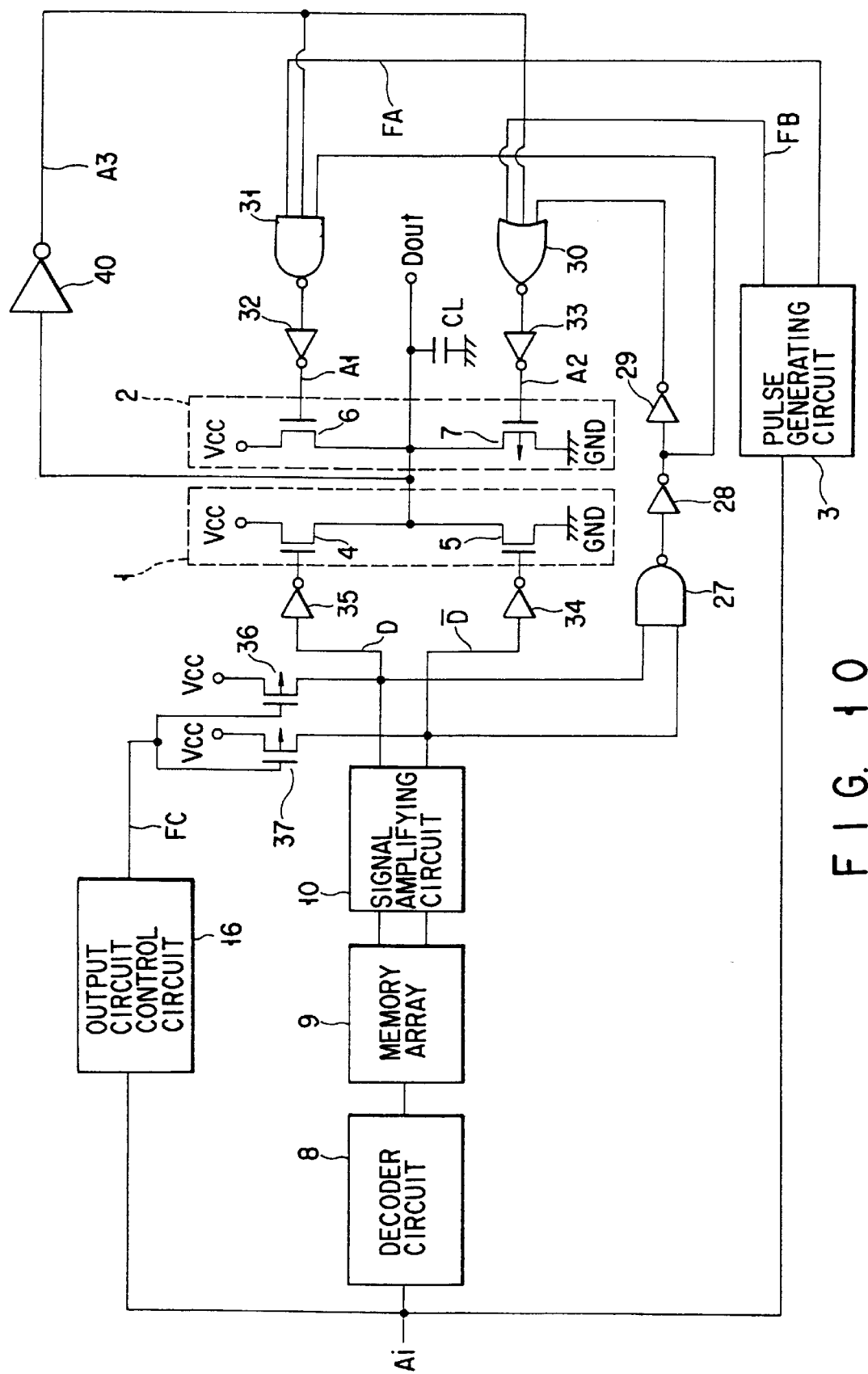
FIG. 10 is a circuit diagram showing the arrangement of the third embodiment of the present invention, which corresponds to the first embodiment of the semiconductor integrated circuit to which the first embodiment of the intermediate potential setting circuit of the present invention in FIG. 1 is applied.

FIG. 10 is a circuit diagram showing the arrangement of the third embodiment of the present invention, which corresponds to the first embodiment of the semiconductor integrated circuit to which the first embodiment of the intermediate potential setting circuit of the present invention in FIG. 7 is applied. Referring to FIG. 10, a semiconductor memory section comprises a decoder circuit 8 for decoding an externally input address signal, a memory array 9 for storing data, and a signal amplification circuit 10 for amplifying data from the memory array 9 and outputting the data. An output circuit control means 16 generates a control signal $F_C$ on the basis of an address signal Ai to control an internal data output circuit 1. The internal data output circuit 1 has an output terminal and outputs data output from the signal amplification circuit 10 to the output terminal. A pulse generating circuit 3 generates a pair of intermediate potential control signals $F_A$ and $F_B$ on the basis of the address signal Ai to control an intermediate potential setting circuit means 2. The intermediate potential setting circuit means 2 includes an n-channel MOSFET 6 and a p-channel MOSFET 7 connected in series between the first and second reference power supplies. The potential of the connection node of the n- and p-channel MOSFETs 6 and 7 connected to the output terminal are fed back to the gates of the n- and p-channel MOSFETs 6 and 7 by an inverter 40 to set the output terminal to the intermediate potential between H level and L level of the output data during a period in which no data is output.

FIG. 11 is a timing chart for explaining the operation of the first embodiment of the semiconductor integrated circuit in FIG. 10. Assume that in an initial state, the address signal Ai, an output Dout, the intermediate potential control signal $F_A$, and data $\overline{D}$ are at L level, and the intermediate potential control signal $F_B$, the output control signal $F_C$, and data D are at H level. When the address signal Ai changes from L level to H level, the pulse generating circuit 3 operates, and the intermediate potential control signals $F_A$ and $F_B$ respectively change to H level and L level, thereby transmitting a pulse signal. When this address signal Ai changes, the output circuit control means 16 also operates, and the output control signal $F_C$ is set at L level. With this operation, p-channel MOSFETs 36 and 37 are turned on to set the input terminals of inverters 35 and 34 to H level. That is, when the data D and $\overline{D}$ are set at H level, both the data are inverted by the inverters 34 and 35, and both the gates of n-channel MOSFETs 4 and 5 are set at L level. As a result, the n-channel MOSFETs 4 and 5 are turned off. In addition, since the output from a NAND circuit 27 is set at L level, the potential of a signal A1 is changed to H level by a NAND circuit 31 and an inverter 32. However, since the output Dout from the output terminal is at L level, a signal A3 is kept at H level, and a signal A2 is kept at L level by a NOR circuit 30 and an inverter 33. For this reason, only the n-channel MOSFET 6 is turned on to set the output Dout from the output terminal at the intermediate potential. Meanwhile, the decoder circuit 8 also operates with a change in the level of the address signal Ai, and data is read out from the memory array 9. The output control signal $F_C$ from the output circuit control means 16 is set at H level immediately before the data stored in the memory array 9 is transferred to the inverters 34 and 35, and the p-channel MOSFETs 36 and 37 are set in an OFF state. At this time, the input data D to the inverter 35 is set at L level, and the input data $\overline{D}$ to the inverter 34 is set at H level. As a result, the n-channel MOSFET 4 of the internal data output circuit 1 is driven to set the output data Dout from the output terminal at H level.

A case wherein the address signal Ai changes from H level to L level will be described next. Assume that the address signal Ai, the output Dout, the intermediate potential control signal $F_B$, the data $\overline{D}$, and the output control signal $F_C$ are at H level, and the intermediate potential control signal $F_A$ and the data D are at L level. The pulse generating circuit 3 operates with a change in the level of the address signal Ai to transmit an H-level pulse signal as the intermediate potential control signal $F_A$ and an L-level pulse signal as the intermediate potential control signal $F_B$. In addition, the output circuit control means 16 also operates with the change in the level of the address signal Ai to set the output control signal $F_C$ at L level. As a result, the p-channel MOSFETs 36 and 37 are turned on, and both the input data D to the inverter 35 and the input data $\overline{D}$ to the inverter 34 are set at H level. With this operation, both the gates of the n-channel MOSFETs 4 and 5 are set at L level by the inverters 34 and 35, and the n-channel MOSFETs 4 and 5 are set in an OFF state. In addition, since the output from the NAND circuit 27 is set at L level, the signal A1 is fixed to L level, but the signal A2 changes to L level. Since the output Dout from the output terminal is kept at H level, only the p-channel MOSFET 7 is turned on to set the output Dout from the output terminal at the intermediate potential. Meanwhile, with a change in the address signal Ai, the decoder circuit 8 operates, and data is read out from the memory array 9. The output control signal $F_C$ is set at H level by the output circuit control means 16 and the p-channel MOSFETs 36 and 37 are turned off immediately before the data stored in the memory array 9 is transferred to the inverters 34 and 35. When the data D is set at H level, and the data $\overline{D}$ is set at L level, the n-channel MOSFET 5 of the internal data output circuit 1 is driven to set the output Dout from the output terminal at L level.

According to the third embodiment, since the potential of the output terminal can be set at the intermediate potential at a high speed, data can be prevented from greatly delaying at the output section. For this reason, high-speed access to the memory can be realized.

(Fourth Embodiment)

Figure 13A:
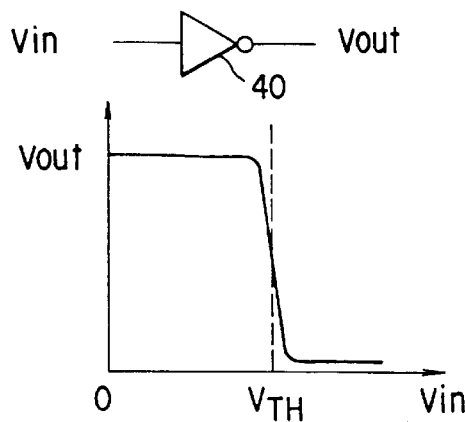
FIG. 13A is a characteristic diagram of the invention circuit in the intermediate potential setting circuit in FIG. 7.
Figure 13B:
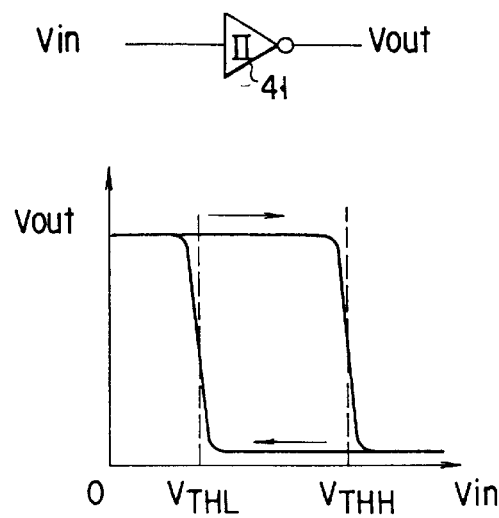
FIG. 13B is a characteristic diagram showing the hysteresis characteristic of a Schmitt trigger circuit of the intermediate potential setting circuit in FIG. 12A.

FIG. 12A is a circuit diagram showing the arrangement of the fourth embodiment of the present invention, which corresponds to the second embodiment of the intermediate potential setting circuit of the present invention. The arrangement of the fourth embodiment is the same as that of the second embodiment except that the inverter 40 in the second embodiment is replaced with a Schmitt trigger circuit 41. In the second embodiment described above, the inverter 40 has only one threshold VTH as shown in FIG. 13A, but the Schmitt trigger circuit 41 has hysteresis characteristics like those shown in FIG. 13B and two threshold levels, i.e., a high threshold $V_{THH}$ and a low threshold $V_{THL}$. That is, the Schmitt trigger circuit 41 operates with the high threshold $V_{THH}$ when the voltage of an input $V_{IN}$ is boosted, and operates with the low threshold VTH when the voltage of the input $V_{IN}$ is lowered. In the fourth embodiment, as shown in FIG. 12B, the high threshold $V_{THH}$ of the Schmitt trigger circuit 41 is set to be VCC–$V_{TN}$>$V_{THH}$, and the low threshold $V_{THL}$ is set to be $V_{TP}$<$V_{THL}$.

Figure 14:
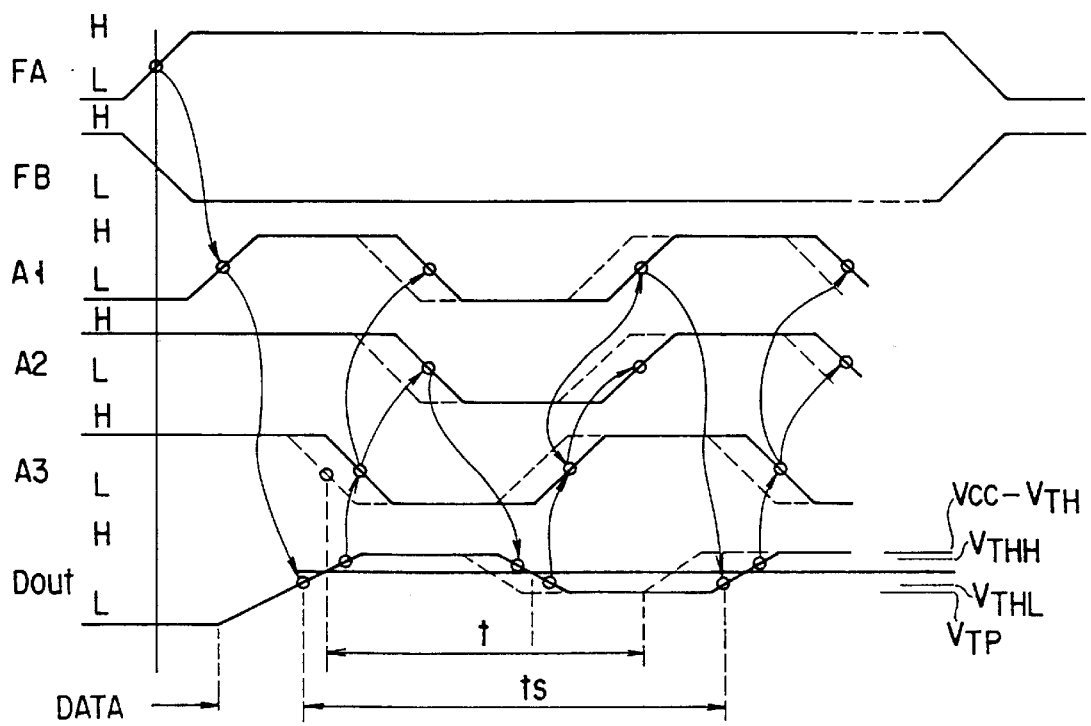
FIG. 14 is a timing chart for explaining the operation of the second embodiment of the intermediate potential setting circuit in FIG. 12A in a case wherein an output Dout from the output terminal changes from L level to an intermediate potential.

FIG. 14 is a timing chart for explaining the operation of the second embodiment of the intermediate potential setting circuit in FIG. 12A. FIG. 14 shows a case wherein the potential of a connection node $N_D$, i.e., an output Dout of the output terminal, is at L level. Since the potential of the connection node $N_D$ is at L level, the potential of a signal A3 is inverted by the Schmitt trigger circuit 41 and set at H level. In this case, when an external pulse generating circuit (not shown) changes an intermediate potential control signal $F_A$ from L level to H level, and changes an intermediate potential control signal $F_B$ from H level to L level, a NAND circuit 31 and a NOR circuit 30 are enabled. Since both the intermediate potential control signal $F_A$ and the signal A3 are at H level, the output from the NAND circuit 31 is at L level. However, the potential of the signal A1 is raised from L level to H level by an inverter 32. In contrast to this, since the intermediate potential control signal $F_A$ intermediate potential control signal $F_B$ and the signal A3 are at L level and H level, respectively, the output from the NOR circuit 30 is at L level, and the potential of the signal A2 is still fixed to H level by an inverter 33. For this reason, an n-channel MOSFET 6 is turned on, but a p-channel MOSFET 7 is kept in an OFF state. As shown in FIG. 12B, therefore, the potential of the output Dout from the output terminal is raised from L level of the output data to an intermediate potential VCC–$V_{TN}$, exceeding the low and high thresholds $V_{THL}$ and $V_{THH}$ of the Schmitt trigger circuit 41, by the n-channel MOSFET 6. That is, if the threshold of the n-channel MOSFET 6 is set to be the threshold $V_{TN}$, the output Dout from the output terminal is raised to the intermediate potential VCC–$V_{TN}$. At this time, owing to the threshold $V_{THH}$ of the Schmitt trigger circuit 41h, the output from the Schmitt trigger circuit 41, i.e., the signal A3, changes from H level to L level. As a result, both the signals A1 and A2 are inverted. With this operation, the n-channel MOSFET 6 is turned off, but the p-channel MOSFET 7 is turned on. As a result, the potential of the output Dout from the output terminal is lowered from the intermediate potential VCC–$V_{TN}$ to an intermediate potential $V_{TP}$ by the p-channel MOSFET 7. At this time, owing to the threshold $V_{THL}$ of the Schmitt trigger circuit 41, the output from the Schmitt trigger circuit 41, i.e., the signal A3, changes from L level to H level. As a result, both the signals A1 and A2 are inverted again. Subsequently, a similar operation is repeated until the intermediate potential control signals $F_A$ and $F_B$ are inverted. In the third embodiment, a transition time ts required to set the output terminal to the intermediate potential is longer than the transition time t, in the second embodiment, which is indicated by the dotted lines in FIG. 14. The above description can apply to a case wherein the output Dout from the output terminal is at H level.

According to the fourth embodiment, since the output terminal is set to the intermediate potential by turning either the n-channel MOSFET 6 or the p-channel MOSFET 7, a through current can be prevented from flowing. Since no through current flows, the charge current supplied to the external load capacitor can be increased to allow a high-speed charging operation. For this reason, the transition time required to set the output terminal to the intermediate potential can be shortened, and the output terminal can be quickly set to the intermediate potential as compared with the prior art. Furthermore, since no through current flows, the power consumption can be reduced.

(Fifth Embodiment)

Figure 15:
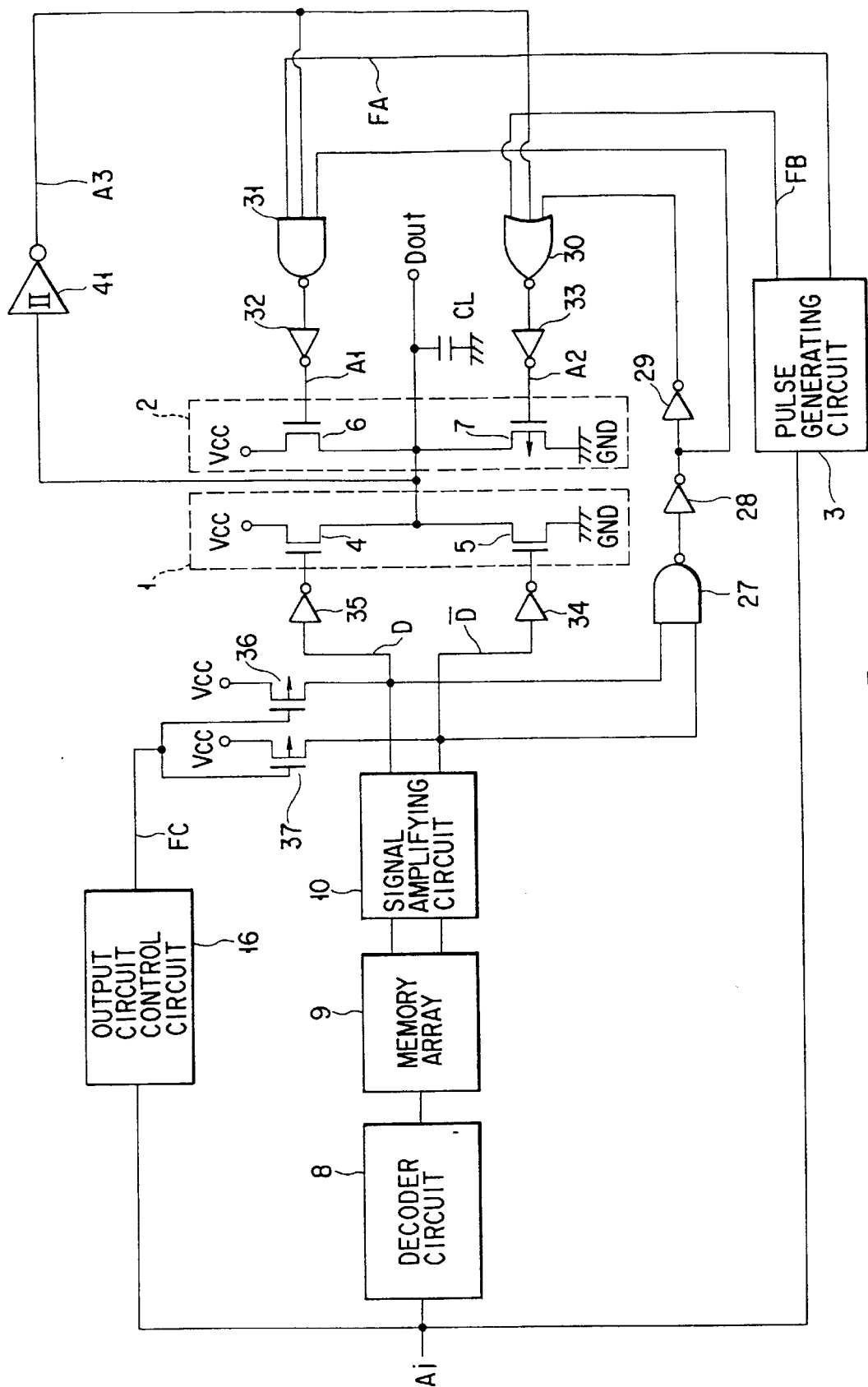
FIG. 15 is a circuit diagram showing the arrangement of the fifth embodiment, which corresponds to the second embodiment of the semiconductor integrated circuit to which the second embodiment of the intermediate potential setting circuit of the present invention in FIG. 12A is applied.

FIG. 15 is a circuit diagram showing the arrangement of the fifth embodiment of the present invention, which corresponds to the second embodiment of the semiconductor integrated circuit to which the second embodiment of the intermediate potential setting circuit of the present invention in FIG. 12A is applied. The arrangement of the fifth embodiment is the same as that of the semiconductor integrated circuit in FIG. 10 except that the inverter 40 is replaced with a Schmitt trigger circuit 41, and hence a description thereof will be omitted.

Figure 16:
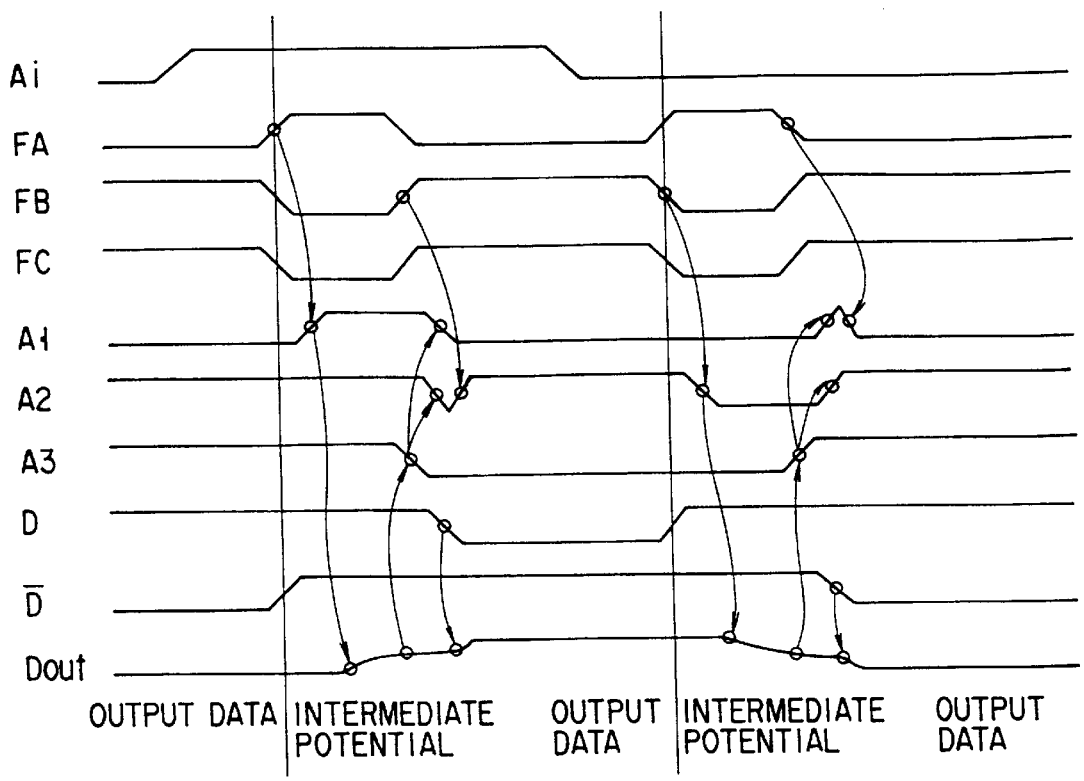
FIG. 16 is a timing chart for explaining the operation of the second embodiment of the semiconductor integrated circuit.

FIG. 16 is a timing chart for explaining the second embodiment of the semiconductor integrated circuit in FIG.

15. Signals A1 and A2 are selectively controlled in the same manner as that indicated by the timing chart of FIG. 11. However, since the inverter 40 and the Schmitt trigger circuit 41 operate differently, a signal A3 are controlled differently with respect to the timing chart of FIG. 11. For this reason, an output Dout from the output terminal is different in waveform from that in FIG. 11. Since other operations are the same as those described with reference to FIG. 11, a description thereof will be omitted.

According to the fifth embodiment, since the potential of the output terminal can be set to the intermediate potential at a high speed, data can be prevented from greatly delaying at the output section. Therefore, high-speed access to the memory can be realized.

(Sixth Embodiment)

Figure 17:
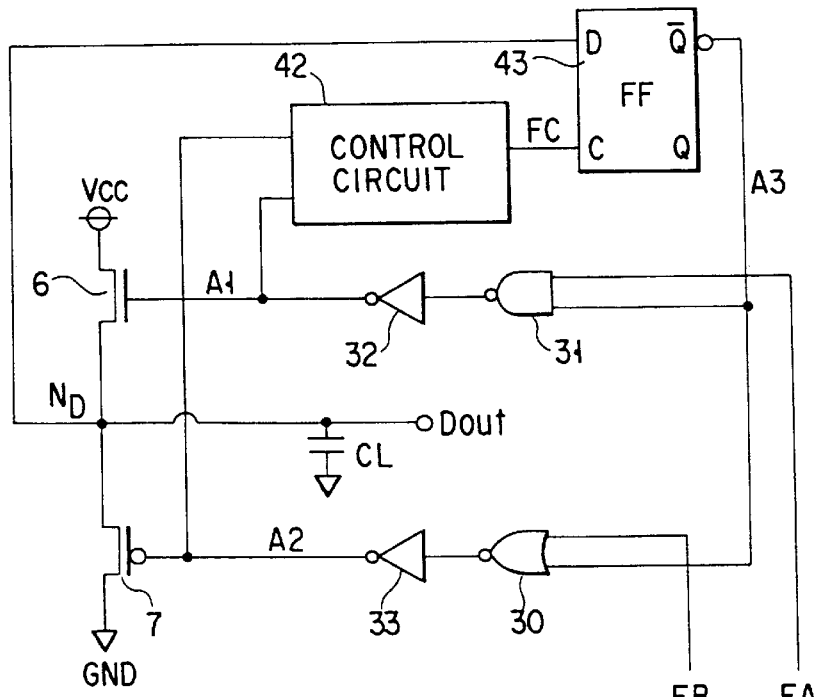
FIG. 17 is a circuit diagram showing the arrangement of the sixth embodiment of the present invention, which corresponds to the third embodiment of the intermediate potential setting circuit of the present invention.

FIG. 17 is a circuit diagram showing the arrangement of the sixth embodiment of the present invention, which corresponds to the third embodiment of the intermediate potential setting circuit of the present invention. The arrangement of the sixth embodiment is the same as that of the second embodiment except that the inverter 40 in the second embodiment is replaced with a D flip-flop 43, and an input signal control circuit 42 constituted by an exclusive NOR (EXNOR) circuit for controlling the D flip-flop 43 is used. Output signals A1 and A2 from inverters 32 and 33 are input to the two input terminals of the signal control circuit 42. An output signal $F_C$ from the input signal control circuit 42 is input to the clock terminal of the D flip-flop 43, and the potential of a connection node $N_D$ is input to the D terminal of the D flip-flop 43. A signal A3 from the $\overline{Q}$ terminal of the D flip-flop 43 is output to the NAND circuit 31 and the NOR circuit 30.

Figure 18:
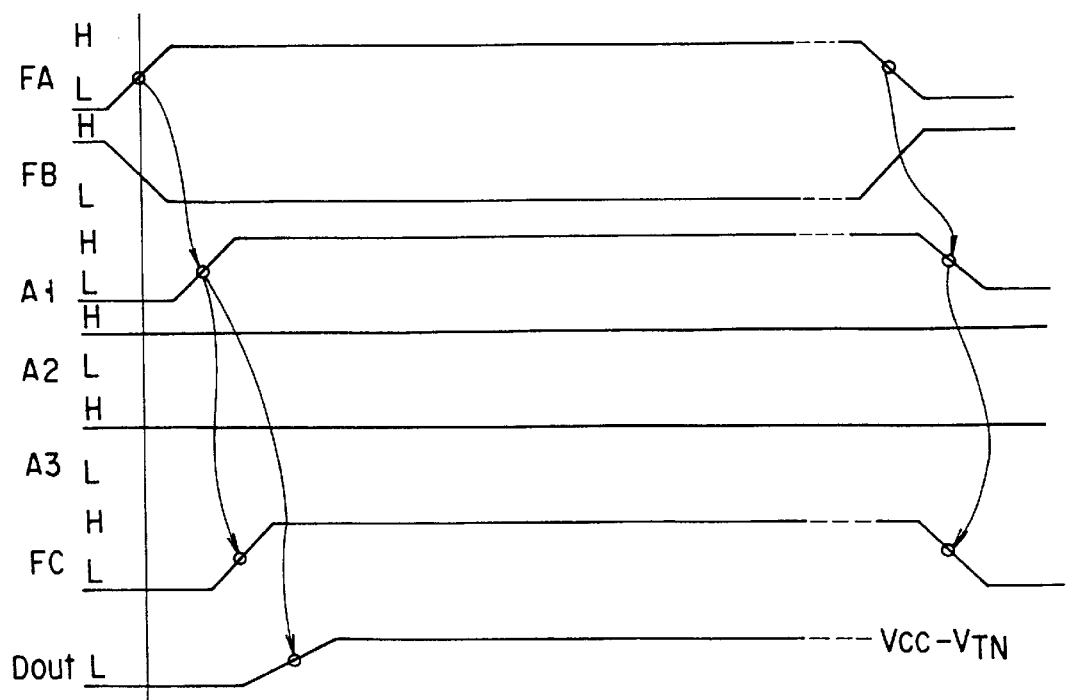
FIG. 18 is a timing chart for explaining the operation of the third embodiment of the intermediate potential setting circuit in FIG. 17 in a case wherein an output Dout from the output terminal changes from L level to an intermediate potential.
Figure 19:
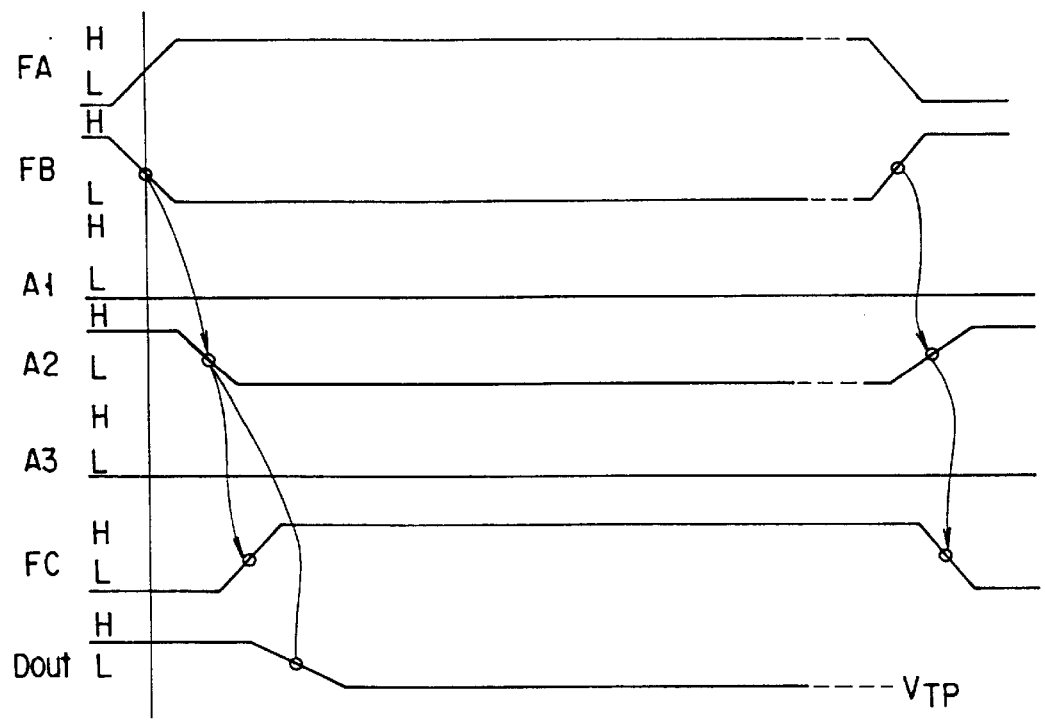
FIG. 19 is a timing chart for explaining the operation of the third embodiment of the intermediate potential setting circuit in FIG. 17 in a case wherein the output Dout from the output terminal changes from H level to an intermediate potential.

FIGS. 18 and 19 are timing charts for explaining the operation of the third embodiment of the intermediate potential setting circuit in FIG. 17. FIG. 18 shows a case wherein the potential of the connection node $N_D$, i.e., an output Dout from the output terminal, is at L level. Since the potential of the connection node $N_D$ is at L level, the potential of the signal A3 is inverted by the D flip-flop 43 and set at H level. In this case, when an external pulse generating circuit changes an intermediate potential control signal $F_A$ from L level to H level, and changes an intermediate potential control signal $F_B$ from H level and L level, a NAND circuit 31 and a NOR circuit 30 are enabled. Since both the intermediate potential control signal $F_A$ and the signal A3 are at H level, the output from the NAND circuit 31 is at L level, but the potential of the signal A1 is raised from L level to H level by the inverter 32. However, since the intermediate potential control signal $F_B$ and the signal A3 are at L level and H level, respectively, the output from the NOR circuit 30 is also at L level, and the signal A2 is fixed to H level by the inverter 33. Since the signal A1 of the two inputs to the input signal control circuit 42 is set at H level, and the signal A2 is kept at H level, the H-level signal $F_C$ as an exclusive NOR output is output as a clock signal to the D flip-flop 43. In addition, an n-channel MOSFET 6 is turned on, but a p-channel MOSFET 7 is kept off. Therefore, the output Dout from the output terminal is raised from L level to an intermediate potential VCC–$V_{TN}$ by the n-channel MOSFET 6. That is, if the threshold of the n-channel MOSFET 6 is set to be a potential $V_{TN}$, the potential Dout of the output terminal is raised to the intermediate potential VCC–$V_{TN}$. At this time, even if the potential Dout of the output terminal changes, the clock signal $F_C$ undergoes no change. For this reason, the output from the D flip-flop 43, i.e., the signal A3, undergoes a change. For this reason, both the signals A1 and A2 are not inverted. With this operation, the n-channel MOSFET 6 is kept in an ON state, whereas the p-channel MOSFET 7 is kept in an OFF state. Therefore, the potential of the output Dout from the output terminal does not change until the intermediate potential control signals $F_A$ and $F_B$ are inverted, and the signal A1 changes from H level to L level.

FIG. 19 shows a case wherein the potential of the connection node $N_D$, i.e., the output Dout from the output terminal, is at H level. Since the potential of the connection node $N_D$ is at H level, the potential of the signal A3 is inverted by the D flip-flop 43 and set at L level. In this case, when the external pulse generating circuit changes the intermediate potential control signal $F_A$ from L level to H level, and changes the intermediate potential control signal $F_B$ from H level to L level, the NAND circuit 31 and the NOR circuit 30 are enabled. Since both the intermediate potential control signal $F_B$ and the signal A3 are at L level, the output from the NAND circuit 31 is at H level, but the potential of the signal A1 is still fixed to H level by the inverter 32. However, since the intermediate potential control signal $F_B$ and the signal A3 are at L level, the output from the NOR circuit 30 also changes from L level to H level, and the potential of the signal A2 is changed from H level to L level by the inverter 33. Since the signal A1 of the two inputs to the input signal control circuit 42 is kept at L level, and the signal A2 is changed to L level, the H-level signal $F_C$ as an exclusive NOR output is output as a clock signal to the D flip-flop 43. Although the n-channel MOSFET 6 is kept off, the p-channel MOSFET 7 is turned on. The output Dout from the output terminal is lowered from H level to an intermediate potential $V_{TP}$ by the p-channel MOSFET 7. That is, if the threshold of the p-channel MOSFET 7 is set to be the intermediate potential $V_{TP}$, the potential Dout of the output terminal is lowered to the intermediate potential $V_{TP}$. At this time, even if the potential Dout of the output terminal changes, since the clock signal $F_C$ undergoes no change, the output from the D flip-flop 43, i.e., the signal A3, undergoes no change. For this reason, both the signals A1 and A2 are kept unchanged without being inverted. With this operation, the p-channel MOSFET 7 is kept in an ON state, whereas the n-channel MOSFET 6 is kept in an OFF state. The potential of the output Dout from the output terminal, therefore, does not change until the intermediate potential control signals $F_A$ and $F_B$ are inverted, and the signal A2 changes from L level to H level.

According to the sixth embodiment, since the output terminal is set to the intermediate potential by turning on either the n-channel MOSFET 6 or the p-channel MOSFET 7, a through current can be prevented from flowing. Since no through current flows, the charge current supplied to the external load capacitor can be increased to allow a high-speed charging operation. For this reason, the transition time required to set the output terminal to the intermediate potential can be shortened, and the output terminal can be quickly set to the intermediate potential as compared with the prior art. Furthermore, since no through current flows, the power consumption can be reduced. Furthermore, owing to the circuit arrangement, the output Dout from the output terminal may vibrate, i.e., oscillate, at the intermediate potential. According to the sixth embodiment, however, such oscillation can be suppressed by the input signal control circuit 42.

(Seventh Embodiment)

Figure 20:
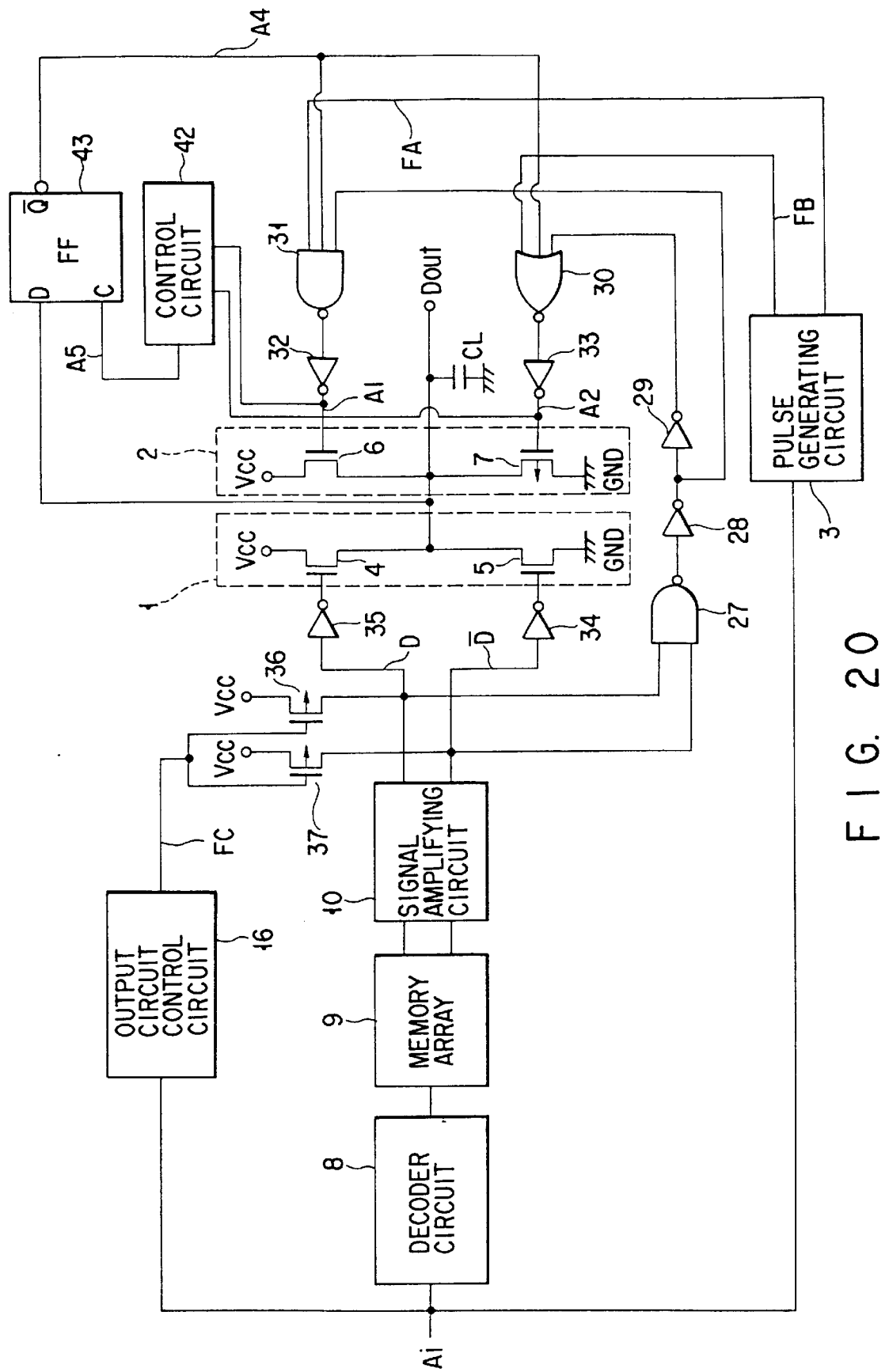
FIG. 20 is a circuit diagram showing the arrangement of the seventh embodiment of the present invention, which corresponds to the third embodiment of the semiconductor integrated circuit to which the third embodiment of the intermediate potential setting circuit of the present invention in FIG. 17 is applied.

FIG. 20 is a circuit diagram showing the arrangement of the seventh embodiment of the present invention, which corresponds to the third embodiment of the semiconductor integrated circuit to which the third embodiment of the intermediate potential setting circuit of the present invention in FIG. 17 is applied. The arrangement of the seventh embodiment is the same as that of the semiconductor integrated circuit in FIG. 10 except that the inverter 40 in FIG. 10 is replaced with a D flip-flop 43, and an input signal control circuit 42 constituted by an EXNOR circuit for controlling the D flip-flop 43 is used, and hence a description thereof will be omitted.

FIG. 21 is a timing chart for explaining the operation of the third embodiment of the semiconductor integrated circuit in FIG. 20. Signals A1 and A2 are selectively controlled in the same manner as that indicted by the timing chart of FIG. 11. However, the input signal control circuit 42 only outputs a pulse signal every time the signals A1 and A2 change, and a signal A4 changes accordingly. For this reason, signals A4 and A5 are different from those shown in the timing chart of FIG. 11. As a result, an output Dout from the output terminal is different in waveform from that in FIG. 11. Since other operations are the same as those described with reference to FIG. 11, a description thereof will be omitted.

According to the seventh embodiment as well, since the potential of the output terminal can be set to the intermediate potential at a high speed, data can be prevented from greatly delaying at the output section. Therefore, high-speed access to the memory can be realized. In addition, vibration, i.e., oscillation, of the output Dout from the output terminal at the intermediate potential can be prevented.

(Eighth Embodiment)

FIGS. 22A and 22B are views for explaining the schematic arrangement and operation of the eighth embodiment of the present invention. As shown in FIG. 22A, the actual circuit arrangement of the eighth embodiment is the same as that of the circuit of the fourth embodiment. In the eighth embodiment, however, as shown in FIG. 22B, high and low thresholds $V_{THH}$ and $V_{THL}$ of a Schmitt trigger circuit 41' are respectively set to be VCC–$V_{TN}$<$V_{THH}$ and $V_{THL}$<$V_{TP}$.

Figure 23:
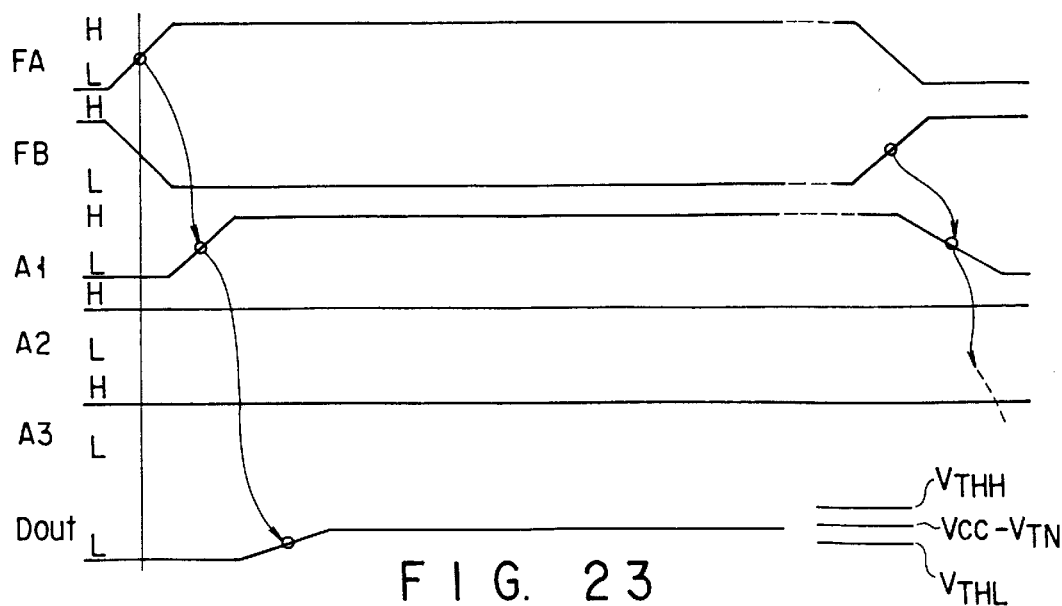
FIG. 23 is a timing chart for explaining the operation of the eighth embodiment of the present invention in a case wherein an output Dout from the output terminal changes from L level to an intermediate potential.
Figure 24:
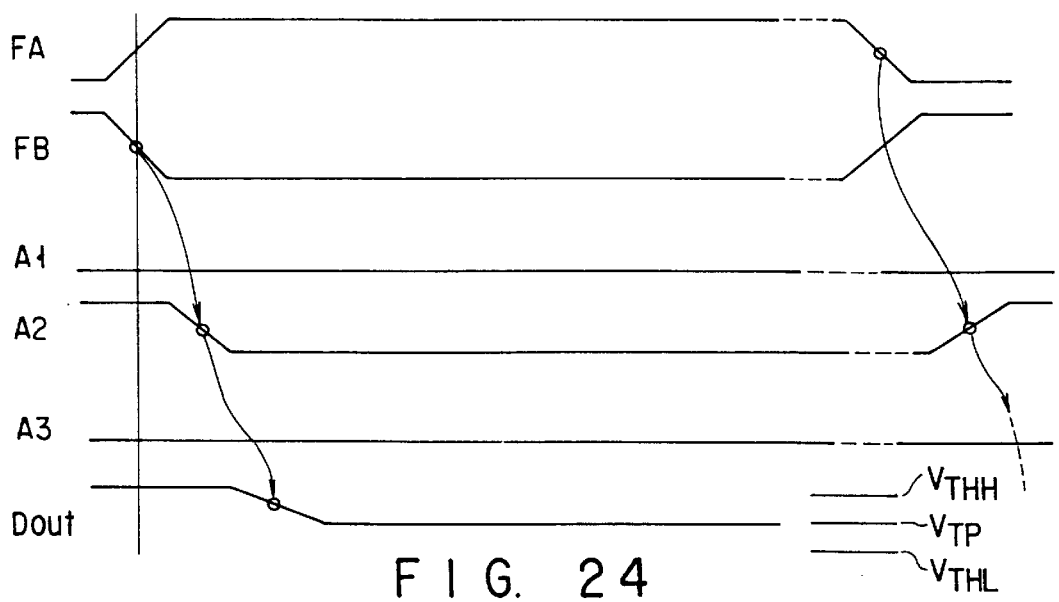
FIG. 24 is a timing chart for explaining the operation of the eighth embodiment of the present invention in a case wherein the output Dout from the output terminal changes from H level to an intermediate potential.

FIGS. 23 and 24 are timing charts for explaining the operation of the eighth embodiment of the present invention. As shown in FIG. 23, when an output Dout from the output terminal changes from L level of output data to an intermediate potential, i.e., the potential of a connection node $N_D$ is at L level, a signal A1 from an inverter 32 changes from L level to H level in accordance with a change in the level of a control signal $F_A$ from L level to H level. Meanwhile, a signal A2 from an inverter 33 undergoes no change and is fixed to H level. Only an n-channel MOSFET 6 is turned on, but a p-channel MOSFET 7 is kept off. When the n-channel MOSFET 6 is turned on, the output Dout from output terminal is raised toward a power supply VCC and changes to an intermediate potential VCC–$V_{TN}$. In this case, since the intermediate potential VCC–$V_{TN}$ is set to be lower than the high threshold $V_{THH}$ of the Schmitt trigger circuit 41', the output from the Schmitt trigger circuit 41', i.e., a signal A3, is not inverted and is kept unchanged. Therefore, the output Dout from the output terminal is also kept at the intermediate potential VCC–$V_{TN}$.

If, as shown in FIG. 24, the output Dout from the output terminal changes from H level to L level, i.e., the potential of the connection node $N_D$ is at H level, the signal A2 from the inverter 33 changes from H level to L level in accordance with a change in the level of a control signal $F_B$ from H level to L level. In contrast to this, the signal A1 from the inverter 32 undergoes no change and is fixed to L level. Only the p-channel MOSFET 7 is turned on, but the n-channel MOSFET 6 is kept off. Since the p-channel MOSFET 7 is turned on, the output Dout from the output terminal is lowered toward a power supply potential GND and changes to an intermediate potential $V_{TP}$. In this case, since the intermediate potential $V_{TP}$ is set to be higher than the low threshold $V_{THL}$ of the Schmitt trigger circuit 41', the output from the Schmitt trigger circuit 41', i.e., the signal A3, is not inverted and is kept unchanged. Therefore, the output Dout from the output terminal is kept at the intermediate potential $V_{TP}$.

According to the eighth embodiment, since a through current can be prevented from flowing, the transition time required to change the output terminal to the intermediate potential can be shortened, and the power consumption can be reduced as compared with the prior art. In addition, in comparison with the fourth embodiment, vibration of the output Dout, i.e., oscillation, at the intermediate potential in the third embodiment can be prevented by setting appropriate conditions associated with the high and lower thresholds $V_{THH}$ and $V_{THL}$ of the Schmitt trigger circuit 41'.

Figure 1:
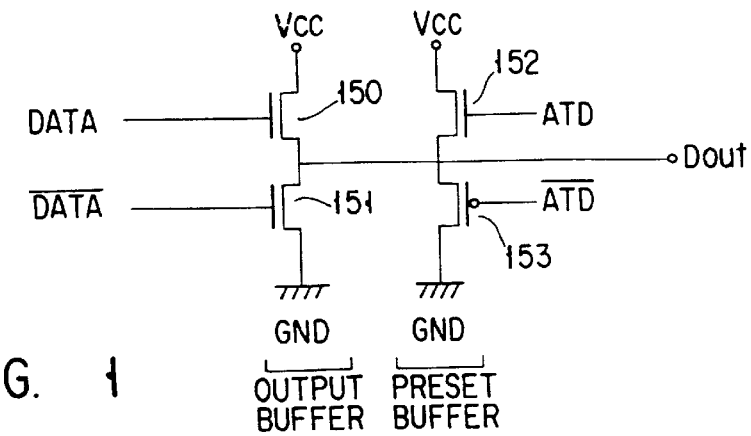
FIG. 1 is a circuit diagram showing the circuit arrangement of a conventional data output circuit.
Figure 2:
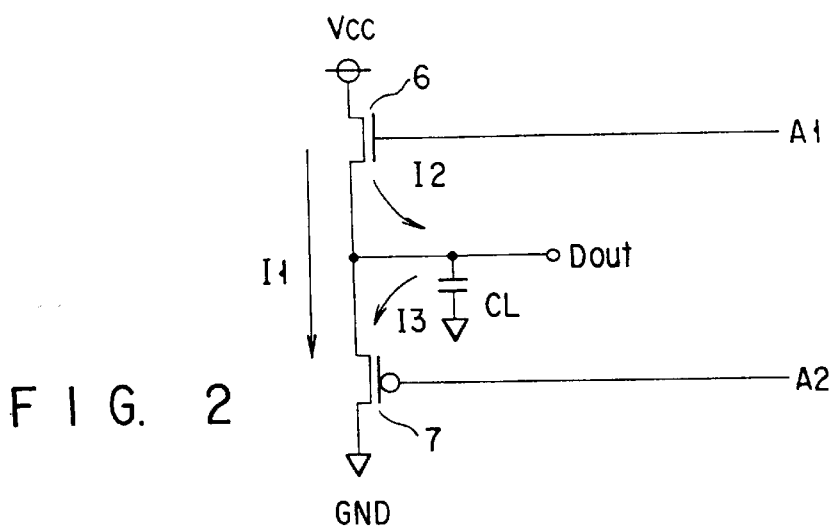
FIG. 2 is a circuit diagram showing the arrangement of a conventional intermediate potential setting circuit.
Figures 3A, 3B:
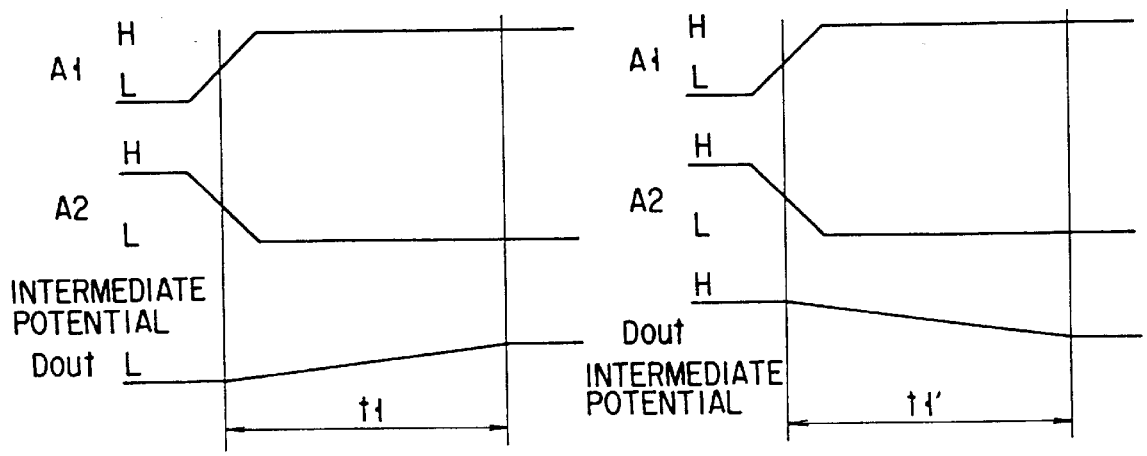
FIGS. 3A and 3B are timing charts for explaining a transition time in the conventional intermediate potential setting circuit in FIG. 2.
Figure 25A:
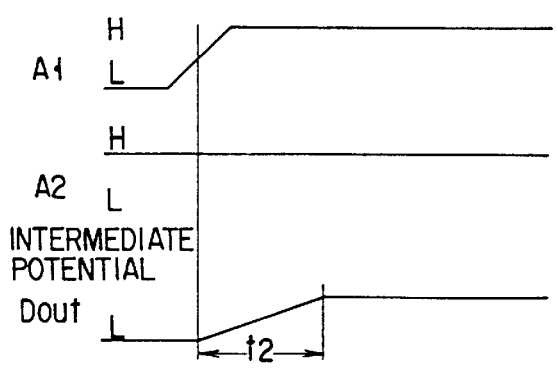
FIGS. 25A and 25B are timing charts for explaining a transition time in the intermediate potential setting circuit of the present invention.
Figure 25B:
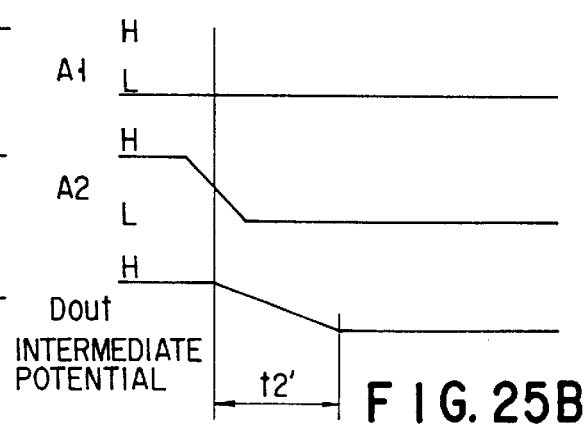

FIGS. 25A and 25B are timing charts for explaining the transition time of the intermediate potential setting circuit of the present invention. As shown in FIG. 25A, a transition time t2 required for the output Dout to change from L level to the intermediate potential is much shorter than the transition time t1 (FIG. 3A) in the prior art. As shown in FIG. 25B, a transition time t2' required for the output Dout to change from H level to the intermediate potential is much shorter than the transition time t1' (FIG. 3A) in the prior art.

As an example to which the intermediate potential setting circuit of the present invention is applied, the semiconductor integrated circuit has been described above. However, the present invention can be applied to circuit units other than the semiconductor integrated circuit as long as the circuit is a digital circuit, has a synchronization circuit, takes much time to change output data between high and lower potentials, and must drive a circuit having a large capacitance at a high speed. For example, the present invention can be applied to a signal generator.

As has described above, according to the present invention, since a through current can be reduced, the power consumption can be reduced, and the operation speed can be increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:
   a semiconductor memory section constituted by a decoder circuit for decoding an externally input address signal, a memory array for storing data, and a signal amplification circuit for amplifying data from said memory array and outputting the data;
   a data output circuit, having an output terminal, for outputting the data output from said signal amplification circuit to the output terminal;
   an intermediate potential setting circuit, having n- and p-channel MOSFETs connected in series between first and second reference power supplies, for feeding back a potential of a connection node of said n- and p-channel MOSFETs connected to the output terminal to gates of said n- and p-channel MOSFETs through an inverter, thereby setting the output terminal to an intermediate potential between high and low potentials of the data during a period in which the data is not output;

output circuit control means for generating a first control signal on the basis of the address signal to selectively cause said data output circuit and said intermediate potential setting circuit to operate; and pulse generating means for generating a second control signal on the basis of the address signal to selectively cause said n- and p-channel MOSFETs of said intermediate potential setting circuit to operate.

2. A semiconductor integrated circuit comprising:

a semiconductor memory section constituted by a decoder circuit for decoding an externally input address signal, a memory array for storing data, and a signal amplification circuit for amplifying data from said memory array and outputting the data;

a data output circuit, having an output terminal, for outputting the data output from said signal amplification circuit to the output terminal;

an intermediate potential setting circuit, having n- and p-channel MOSFETs connected in series between first and second reference power supplies, for feeding back a potential of a connection node of said n- and p-channel MOSFETs connected to the output terminal to gates of said n- and p-channel MOSFETs through a Schmitt trigger circuit, thereby setting the output terminal to an intermediate potential between high and low potentials of the data during a period in which the data is not output;

output circuit control means for generating a first control signal on the basis of the address signal to selectively cause said data output circuit and said intermediate potential setting circuit to operate; and pulse generating means for generating a second control signal on the basis of the address signal to selectively cause said n- and p-channel MOSFETs of said intermediate potential setting circuit to operate.

3. A semiconductor integrated circuit comprising:

a semiconductor memory section constituted by a decoder circuit for decoding an externally input address signal, a memory array for storing data, and a signal amplification circuit for amplifying data from said memory array and outputting the data;

a data output circuit, having an output terminal, for outputting the data output from said signal amplification circuit to the output terminal;

an intermediate potential setting circuit, having n- and p-channel MOSFETs connected in series between first and second reference power supplies, for feeding back a potential of a connection node of said n- and p-channel MOSFETs connected to the output terminal to gates of said n- and p-channel MOSFETs through a D flip-flop circuit and a control circuit therefor, thereby setting the output terminal to an intermediate potential between high and low potentials of the data during a period in which the data is not output;

output circuit control means for generating a first control signal on the basis of the address signal to selectively cause said data output circuit and said intermediate potential setting circuit to operate; and pulse generating means for generating a second control signal on the basis of the address signal to selectively cause said n- and p-channel MOSFETs of said intermediate potential setting circuit to operate.

\* \* \* \* \*

UNITED STATES PATENT AND TRADEMARK OFFICE
CERTIFICATE OF CORRECTION

PATENT NO. : 5,831,908
DATED : November 3, 1998
INVENTOR(S) : Tsuji

It is certified that error appears in the above-identified patent and that said letters patent is hereby corrected as shown below:

Title page, column 1, item [30] delete the following

"Aug. 31, 1994 [JP]   Japan......................6-230461".

Signed and Sealed this

Twenty-seventh Day of April, 1999

Attest:

Q. TODD DICKINSON

*Attesting Officer*    *Acting Commissioner of Patents and Trademarks*